United States Patent [19]

Terao

[11] Patent Number: 5,105,254
[45] Date of Patent: Apr. 14, 1992

[54] ROD ASSEMBLY FOR MANUFACTURING LARGE WAFER FOR ELECTRONIC DEVICES

[75] Inventor: Noboru Terao, Itami, Japan

[73] Assignee: Mitbushiki Denki Kabushiki Kaisha, Tokyo, Japan

[21] Appl. No.: 427,887

[22] Filed: Oct. 30, 1989

[30] Foreign Application Priority Data

Nov. 1, 1988 [JP] Japan .................................. 63-277975

[51] Int. Cl.$^5$ .................... H01L 29/161; H01L 29/04; H01L 27/02; H01L 21/461
[52] U.S. Cl. ......................................... 357/61; 357/0; 357/40; 357/85; 437/249
[58] Field of Search ....................... 437/249, 241, 225; 51/290, 65, 323; 357/55, 40, 61, 60

[56] References Cited

U.S. PATENT DOCUMENTS 4,632,884 12/1986 Skikatami et al. .............. 437/249 X

FOREIGN PATENT DOCUMENTS 3917869 7/1961 Japan .

OTHER PUBLICATIONS

VLSI Fabrication Principles, Silicon and Gallium Arseaide Sorab K. Ghandhi, 1982.
Semiconductor Devices, Physics and Technology S. M. Sle, 1985.
M. Shimbo et al., "Silicon-to-Solicon Direct Bonding Method", *J. Appl. Phys.* 60(8), Oct. 15, 1986, pp. 2987-2989.
*Nikkei Microdevices*, Mar. 1988, pp. 82-98.

Primary Examiner—Rolf Hille
Assistant Examiner—Mahshid Saadat
Attorney, Agent, or Firm—Lowe, Price, LeBlanc & Becker

[57] ABSTRACT

The rod assembly for wafers comprises a plurality of rods, made of materials to be used as the wafers used for electronic devices which are assembled in parallel and bonded with each other into an integrated body. Wafers used for electronic devices can be obtained by slicing the rod assembly for the wafers. Mirror-finished bonded face is formed to the outer surface for each of the rods. The bonded face to each of the rods is cleaned by a surface treatment using chemicals. Subsequently, respective rods are assembled in parallel and brought into contact with each other at their respective bonded faces. The thus prepared rods are maintained in a heated atmosphere into an integrated body. Then, the rod assembly is applied with slicing for providing wafers used for electronic devices. Since the rod assembly has a structure in which a plurality of the rods are assembled in parallel and bonded with each other into an integrated body, the diameter for the rod assembly can remarkably be increased. Accordingly, the diameter of the wafers obtained by slicing the rod assembly is also increased remarkably. Since the wafer diameter is increased remarkably, the cost per one electronic device formed on the wafer is also reduced remarkably.

40 Claims, 15 Drawing Sheets

FIG. 31 PRIOR ART
FIG. 32 PRIOR ART
FIG. 33 PRIOR ART
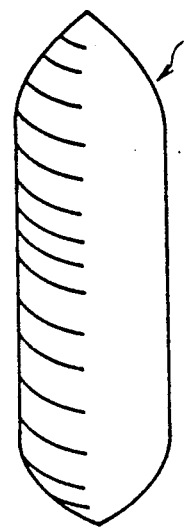
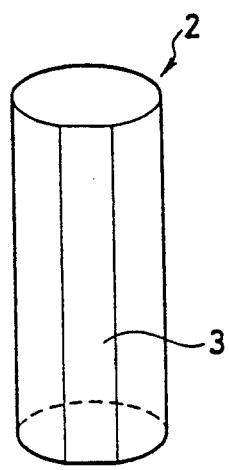
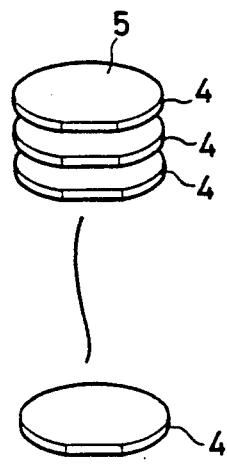
FIG. 34 PRIOR ART
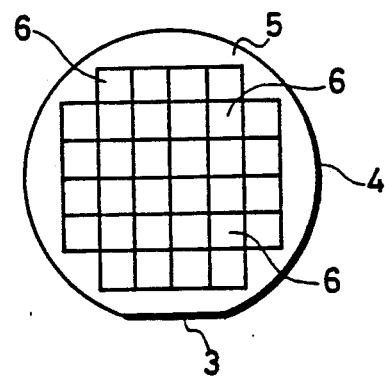

ROD ASSEMBLY FOR MANUFACTURING LARGE WAFER FOR ELECTRONIC DEVICES

BACKGROUND OF THE INVENTION

1. Field of the Invention

The present invention relates to a rod assembly for providing a plurality of wafers used for electronic devices by slicing, as well as a method of producing wafers used for electronic devices.

2. Description of the Background Art

Production steps for typical wafers used for electronic devices employed so far are to be explained referring to FIGS. 31 through 33.

At first, a Si single crystal ingot 1 is prepared as shown in FIG. 31. For obtaining a plurality of Si single crystal wafers each of an identical diameter, the outer circumference of the Si single crystal ingot 1 is shaped into a regular cylindrical form. Further, the upper end and the lower end in the longitudinal direction of the Si single crystal ingot 1 are removed. As shown in FIG. 32, a planar portion 3 extended in the longitudinal direction is formed to the Si single crystal rod 2 shaped into the regular cylindrical form for indicating the direction of the crystallographic axis of the single crystals. Then, the rod 2 of Si single crystals is subjected to slicing, thereby providing a plurality of Si single crystal wafers 4 each of a thickness of several hundreds of micrometers. A plurality of wafers 4 thus obtained are shown in FIG. 33. The main surface 5 of the wafer 4 is mirror-finished by means of lapping and polishing. Referring to FIG. 34 illustrating the plan view of the wafer 4, a plurality of semiconductor integrated circuits 6 are formed on the main surface 5 of the wafer 4 in the subsequent steps.

As shown in FIG. 34, various advantages can be obtained by forming a plurality of semiconductor integrated circuits 6 on one wafer 4. Before the advent of semiconductor devices, individual electronic devices such as vacuum tubes, resistance elements and capacitance elements had to be manufactured, basically, one by one even if they are mass-produced mechanically. In addition, before the advent of the semiconductor integrated circuit, electronic circuits had to be constituted by individual operations mainly by means of soldering. For instance, operations for connecting copper wires by means of soldering, operations for connection individual devices to printed circuit boards by means of soldering, etc. were required respectively.

On the other hand, with the technique of forming a plurality of semiconductor integrated circuits on one identical wafer, a plurality of identical circuits can be formed at a same time on one wafer, basically, by photolithography techniques. Accordingly, the manufacturing cost per one identical circuit constitution is outstandingly reduced by the technique of forming a plurality of integrated circuits on one identical wafer as compared with the prior art techniques requiring individual operations as described above.

For forming a semiconductor integrated circuit, processing steps before and after the photolithography step described above have also been conducted on a single wafer or on pluralities of wafers at a time. This also contributes to the reduction of the manufacturing cost par one identical circuit constitution. Specifically, the photolithography step is preceded and followed by various steps such as an epitaxial step for laminating crystals on a Si single crystal wafer, an ion implantation step for introducing impurities into the single crystal wafer, a diffusion step for diffusing impurities introduced into the wafer, an oxidation step of applying an oxidative treatment to a specific region for selectively introducing impurities into the wafer or protecting the bonded surface, a CVD step, a metallizing step for forming electrodes or wirings, etc. These steps are applied not individually to each of the circuits but on every single crystal wafers or pluralities of the single crystal wafers.

As has been described above, the manufacturing cost per identical circuit can be reduced significantly by simultaneously forming a plurality of identical semiconductor integrated circuits on one identical single crystal wafer. For further reducing the manufacturing cost per one circuit the number of identical semiconductor integrated circuits that can be formed at a same time on the wafer may be increaesd. In order to realize this, there have been employed a method of reducing a chip area by miniaturizing the circuit structure and a method of increasing the area of the single crystal wafer by increasing the diameter of the wafer.

Miniaturization of the circuit has developed considerably for several years after the establishment of the semiconductor technology. The value of the minimum line width in the photolithography technique at the initial stage, which was greater than 10 $\mu$m, has recently been reduced to a value of less than 1.0 $\mu$m. In this case, the effect in view of the area is more than 100 times.

In the same way, there has been a considerable development in increasing the wafer diameter. The diameter of the wafer at about 1 inch level at the initial stage has recently been increased to about 10 inch level The area effect in this case is also of about 100 times. As a synergistic effect obtained from the development for the miniaturization of the circuit and that from the increase in the wafer diameter, the area effect is now about ten thousands of times. It is apparent that this provides one of the bases for the development of the semiconductor integrated circuits and the development of the electronic technology at present.

However, as compared with the technical progress of simultaneously forming a plurality of identical semiconductor integrated circuits, the progress in the miniaturization of circuits and the increase in the wafer diameter are relatively slow.

The leading principle for miniaturizing the minimum line width in the photolithography technology from the value greater than 10 $\mu$m to the value of less than 1.0 $\mu$m mainly consists in removal of defects. That is, for miniaturizing the circuits, it has been conducted to remove dusts present in the production steps, ensure the pattern accuracy by ensuring the mechanical accuracy for mask alignment upon photolithography, or eliminate defects or unnecessary impurities present in crystals or thin films. Accordingly, in order to realize them, not only the softwares for the steps have to be changed but also change of hardwares such as introduction of production facilities of higher performance has been required. That is, much investment in equipment cost is necessary on every reduction of design rules. In this way, if the production cost per identical circuit construction is intended to be reduced by the miniaturization of the circuits, the production cost can not be reduced as expected because of much investment in equipment.

In the design rules at present, there is a problem in the miniaturization at a submicron level of less than 1.0 μm. As the miniaturization is developed further within such a level, various problems are actually brought about.

At first, in the same way as in the miniaturizing progress conducted so far, much investment in equipment is required along with the development of the miniaturization, as well as the number, size and amount of defects to be eliminated becomes higher. Accordingly, the cost performance in the production facility is worsened. That is, the ratio (increment in investment in equipment)/(circuit miniaturization rate) is increased.

Next, additional production steps are required and, accordingly, the production cost is increased. For instance, if circuit miniaturization is intended to attain by applying improvement to steric structures (three dimensional structures) rather than by miniaturizing the planar circuit constitution, this increases the number of production steps required per unit wafer such as addition of trenching steps or lamination steps.

Finally, there is a physical limit in view of the dimension for producing integrated circuits. For instance, as a light source for mask alignment by photolithography, UV-ray have usually been employed in the level of the existent design rules. However, since UV-rays bring about deflection or interference, such UV-rays can no more be used under the design rule at submicron level. Accordingly, use of radiation-rays will be necessitated as a light source for the mask alignment by photolithography.

In view of the foregoing, difficulty in the circuit production is increased as the present design rule (e.g. the minimum dimension permitted) is reduced. An extreme difficulty is expected for reducing the minimum line width in the photolithography from 1.0 μm level to 0.1 μm level, that is, to increase the area effect by 100 times. Under the design rule at a submicron level, the reduction for the cost of semiconductor integrated circuits in accordance with the reduction in the chip area by the circuit miniaturization is saturated. That is, further miniaturization will be accomplished at a cost which will preclude further reduction in cost per chip.

Increase in the wafer diameter is determined, at first, by the production technology for single crystal ingot. For Si single crystal wafers at a mass production level, the maximum diameter is 6 in. at present. The maximum diameter for Si single crystal wafers at a trial level is 10 inch. The leading principle for increasing the wafer diameter from 1 inch level to 10 inch level consists in the scale-up of the facilities and removal of defects. That is, for the production of single crystal ingots of larger diameter, a facility of greater scale corresponding to the size is inevitably necessary. Along with the increase in the diameter of single crystal ingots, defects caused by localized stresses, etc. are brought about. Then, in order to eliminate such defects. more accurate thermal and mechanical control are necessary upon production of single crystal ingots. For more accurate thermal and mechanical control, it is necessary to provide additional control steps and make the production facility per se more accurate. In this way, increase in the diameter of single crystal ingots has a technical limit and also involves a drawback that it increase the cost for the production facility.

The maximum diameter of Si single crystal ingots at the trial level is limited within a level of 10 inch because of the reasons as described above. Further, the increase in the diameter of the Si single crystal wafer have developed from 2 inch level only by each step of 1-2 inch because of the same reasons as described above. The foregoing difficulty in increased along with the increase in the ingot diameter. That is, an extreme difficulty is expected for increasing the maximum ingot diameter from the 10 inch level to the 20 inch level, that is, for increasing the area effect by four times. After all, reduction of the cost for the semiconductor integrated circuits in compliance with the increase in the area of the single crystal wafer by the increase in the ingot diameter is saturated. That is, capital costs of producing large diameter crystals offset economics of producing more chips per wafer at larger wafer diameters.

Furthermore, increase in the wafer diameter by the step of 1-2 inch results in additioned economical difficulty. That is, if wafers of larger diameter have once been put to practical use, the cost for the semiconductor integrated circuits produced by using such wafers is reduced as compared to the semiconductor integrated circuits produced so far by using prior wafers, that is, by using wafers of smaller diameter. Accordingly, wafers of smaller diameter employed so far lose their competitive power in the market. Thus, since there may occur such a situation that production facilities for those wafers having relatively smaller diameter have to be discarded before reasonable depreciation as the wafers of relatively large diameter are put to practical use, Si single crystal manufacturers can not easily put the increase for the wafer diameter to practical use. In addition, putting the increase in the wafer diameter to practical use requires production facilities for semiconductor integrated circuits in compliance with larger diameter wafers. That is, along with the increase in the wafer diameter, more investment in equipment is required.

As has been described above, if wafers of relatively larger diameter are put to practical use, semiconductor integrated circuits using wafers of smaller diameter employed so far lose their market competitive power. Accordingly, most of production facilities for semiconductor integrated circuits used for the wafers of relatively smaller diameter have to be discarded before reasonable depreciation or their use have to be interrupted in the first line. In view of such situations, manufacturers for semiconductor integrated circuits can not easily put the increase for the wafer diameter into practical use. The maximum diameter of Si single crystal wafers at a practical level is limited at present to 6 inch level although the maximum diameter of Si single crystal wafers is 10 inch at the trial level, because of the background as has been described above.

As has been described above, although the cost for semiconductor integrated circuits has been reduced up to now by the reduction of the chip area due to circuit miniaturization and by the increase in the area of the single crystal wafers by enlarging the wafer diameter, reduction in the cost have gradually been saturated at present.

SUMMARY OF THE INVENTION

An object of the present invention is to provide a rod assembly used for wafers capable of remarkable reduction of the cost of semiconductor integrated circuits.

Another object of the present invention is to provide wafers used for electronic devices having a considerably greater area as compared with that of conventional wafers.

A further object of the present invention is to provide a method for producing wafers capable of remarkably reducing the cost for semiconductor integrated circuits.

A still further object of the present invention is to provide a method for producing wafers used for electronic devices having considerably greater area as compared with that of conventional wafers.

The rod assembly in accordance with the present invention provides a plurality of wafers used for electronic devices by slicing, in which a plurality of rods prepared from materials which constitute wafers used for electronic devices are assembled in parallel and connected with each other into an integrated body.

The wafer used for electronic devices in accordance with the present invention is obtained by applying slicing of the rod assembly as described above.

In the method of producing wafers used for electronic devices in accordance with the present invention, a plurality of rods are prepared at first and a mirror-finished joining surface is formed to the outer surface for each of the rod members. Then, the joining surface for each of the rods is cleaned by surface treatment using chemicals. Then, respective rods are assembled in parallel and respective joining surfaces are brought into contact with each other to prepare a rod assembly as an assembly of the respective rods. members. Then, the rod assembly is maintained in a heated atmosphere. Finally, wafers for electronic devices are obtained by applying slicing of the rod base material formed as an integrated body.

Since the rod assembly has a structure in which a plurality of rods are assembled in parallel and connected with each other into an integrated body, the diameter of the integrated body of rod assembly can be remarkably increased. Accordingly, the diameter of the wafers obtained by slicing the rod assembly is also increased remarkably. Since the wafer diameter is increased remarkably, the cost per one electronic device on the wafer is also reduced remarkably.

As the number of the rods assembled in parallel is increased, the diameter of the rod assembly is increased correspondingly. It is technically impossible to obtain a rod assembly of such a large diameter as obtained in accordance with the present invention from one ingot or, if it is possible, only at a remarkable increase in the production cost.

In the present invention, since the diameter of the ingot per se is not increased, it is possible to continue the use of the existing ingot production facilities without discarding them.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 31 is a perspective view illustrating a Si single crystal ingot;

FIG. 32 is a perspective view illustrating a rod obtained by fabricating the single crystal ingot shown in FIG. 31;

FIG. 33 is perspective view illustrating wafers obtained by slicing the rod shown in FIG. 32;

FIG. 34 is a plan view illustrating a state in which a plurality of semiconductor integrated circuits are formed on the main surface of the wafer shown in FIG. 33.

DESCRIPTION OF THE PREFERRED EMBODIMENTS

Figure 1:
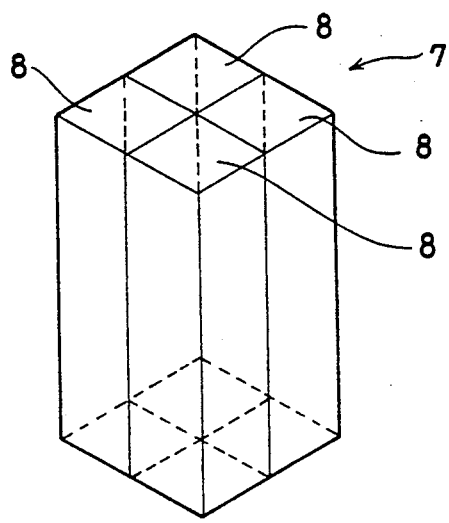
FIG. 1 is a perspective view illustrating a rod assembly for one embodiment according to the present invention.
Figure 2:
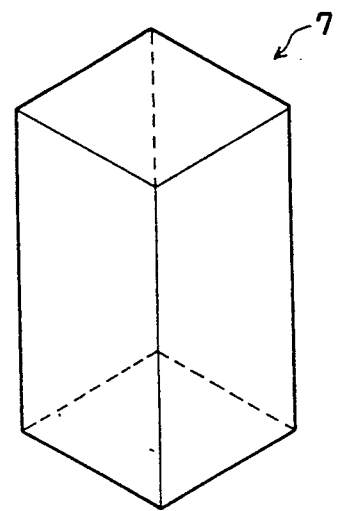
FIG. 2 is a perspective view illustrating the state of the rod assembly after applying heat treatment.
Figure 3:
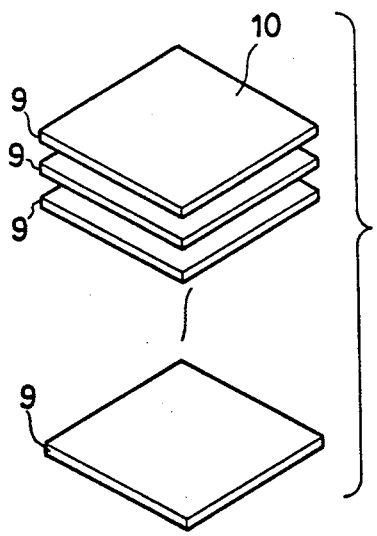
FIG. 3 is a perspective view illustrating wafers used for electronic device obtained by slicing the rod assembly shown in FIG. 2.
Figure 4:
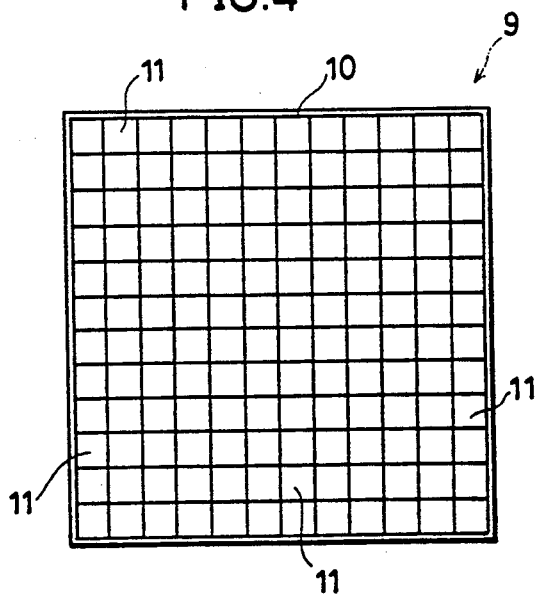
FIG. 4 is a plan view illustrating the state in which a plurality of a semiconductor integrated circuits are formed on the wafer.

A rod assembly 7 shown in FIG. 1 comprises four rods 8 each of a square prism shape prepared from Si single crystals which are assembled in parallel and connected with each other. The rod assembly 7 as an assembly of fours 8 is then placed in a high temperature atmosphere. By the heat treatment, respective rods 8 are firmly bonded to each other and, as a result, the rod assembly 7 exhibits an appearance as if it was a single rod cut out from one Si single crystal ingot as shown in FIG. 2. By slicing the rod 8, a plurality of Si single crystal wafers 9 used for a plurality of electronic devices can be obtained as shown in FIG. 3. Of course, it is possible to reform the circumference of the rod member 8 before slicing. The main surface 10 of the wafer 9 is mirror finished, on which a plurality of semiconductor integrated circuits 11 are formed as shown in FIG. 4.

Figure 5:
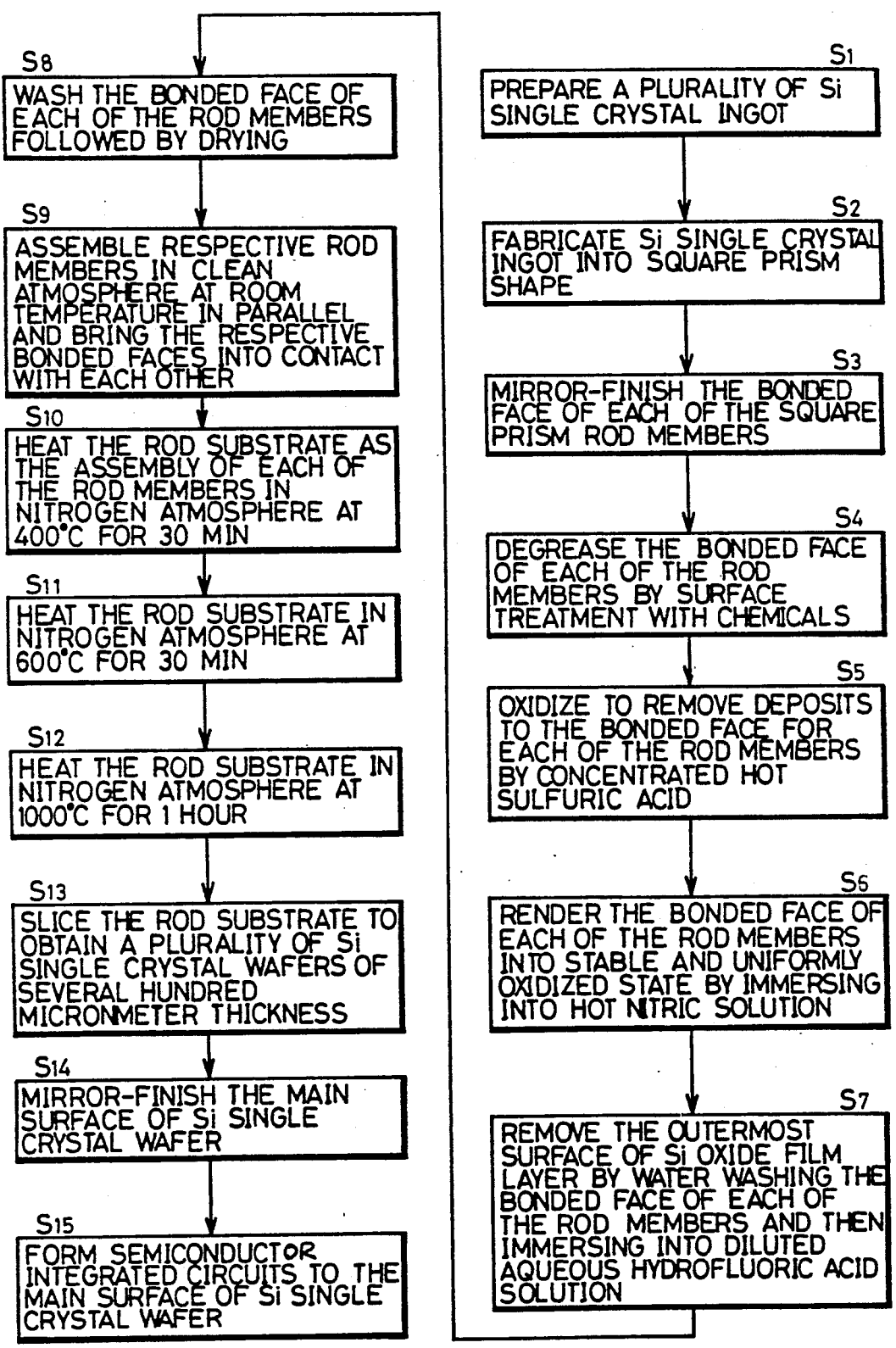
FIG. 5 is a step chart illustrating the production steps from the stage of preparing an Si single crystal ingot to the formation of semiconductor integrated circuit.

FIG. 5 shows a preferred sequence of production steps for forming semiconductor integrated circuits on the main surface of the Si single crystal wafer. The production steps for forming the semiconductor integrated circuits are to be explained mainly referring to FIG. 5.

Figure 6:
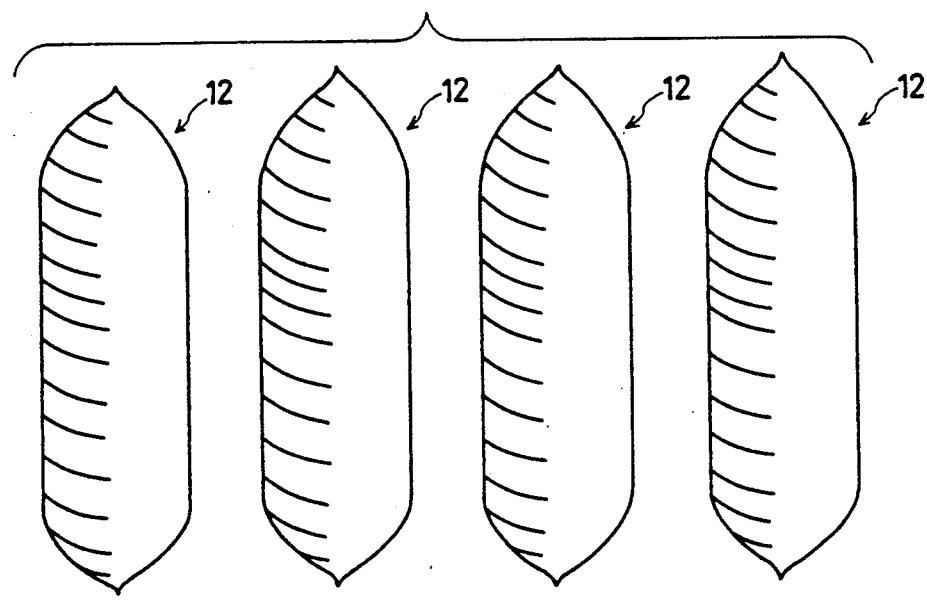
FIG. 6 is a perspective view illustrating four single crystal ingots.

At first, four Si single crystal ingots 12 as shown in FIG. 6 are prepared (step S1).

Figure 7:
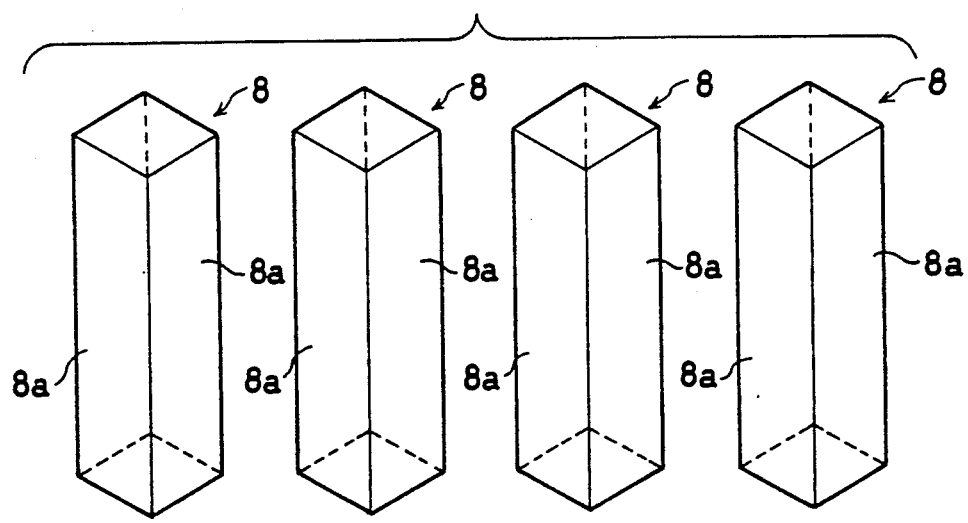
FIG. 7 is a perspective view illustrating four rods obtained by fabricating the single crystal ingots shown in FIG. 6.

Each of the Si single crystal ingots 12 is removed with the upper end and the lower end in the longitudinal direction and, further, applied with grinding for the outer circumferential portion thereof to be formed into a square prism rod 8 (step S2). Thus, four square prism rods 8 each of an identical size are prepared as shown in FIG. 7. The side 8a of the rod 8 is selected so as to direct a specific direction in order to indicate the direction of crystallographic axis of Si single crystals.

Each of the rods 8 has four sides 8a, among which specific sides to be in contact with adjacent rods are mirror-finished by lapping and polishing (step S3). In this case, it is desirable that the surface accuracy on the mirror-finished surface is such that the flatness is less than 10 μm and the surface roughness is less than 10 nm. The accuracy at such a level can easily be attained by the existent techniques.

Then, surface treatment by means of chemicals is applied to the sides, which are to be joined, of each of the rods 8 shaped into the square prism form. At first, the side of the rod 8 is coarsely washed and then degreased by being immersed in heated trichloroethylene (step S4).

Then, the side of the rod 8 is immersed in a heated concentrated sulfuric acid (step S5). Deposits adhered to the side member 8 are removed by oxidation by the oxidative effect of the concentrated sulfuric acid. Possible deposits are, four example, organic dusts, etc. or metal dusts, etc.

Then, after washing the side of the rod 8 with water, the side is immersed in a heated nitric acid solution (step S6). Si atoms situated on the side of the rod 8 are oxidized by the oxidative effect of nitric acid and, as a result, the side of the rod 8 is rendered from instable and not uniformly oxidized state into a stable and uniformly oxidized state.

Then, after washing the side of the rod 8 with water, the side is immersed in a diluted aqueous fluoric acid solution (step S7). Then, the outermost surface of Si oxide film layers formed on the side of the rod 8 is removed by the etching effect of fluoric acid to the Si oxide film layers and, at the same time, unnecessary atoms present at the outermost surface of the side are also removed.

The steps may be applied repeatedly as required. Particularly, for rendering the outermost surface on the side of the rod 8 into oxidized state or hydroxidized state, surface treatment using a nitric solution or a hydrogen peroxide solution may be applied to the side of the rod 8.

Then, each of the rods 8 is washed with water and dried (step S8).

Then, four square prism rods 8 shown in FIG. 7 are assembled in parallel in a clean atmosphere at a room temperature so that their respective bonding faces (sides) are brought into contact with each other (step S9). The rod assembly 7 as an assembly of four rods 8 is shown in FIG. 1. If the side for each of the rods 8 finished into a mirror-face state is an ideal surface in view of atom arrangement, respective rods 8 assembled in parallel and brought into contact with each other, theoretically, form a jointless structure of Si single crystals. However, in an actual state, the surface of the side 8a for each of the rods 8 is different from the ideal state. For instance, when the side 8a of the rod 8 is observed under magnification, the side will somewhat waving and a plurality of irregularities will be formed thereon. Accordingly, when the sides 8a for the respective rods 8 are brought into contact with each other, the portion of contact is not present over the entire surface of the side of the rod 8 but is present only in a partial region in view of the atom arrangement.

If the cleaning treatment is applied in a clean atmosphere, for example, to the sides of the respective rods 8 in contact with adjacent rods 8, a great amount of deposits such as dust, etc. are deposited to the sides from a micro point of view. Presence of such deposits hinder the contact between each of atoms for the respective rods 8. Further, Si atoms are not ideally exposed on the side for each of the rods 8, but the surface portion of the side is generally in an oxidized or hyrdroxidized state. In addition, the oxide or hydroxide layers do not constitute a single atom layer but are in the state in which a plurality of not aligned atoms are overlapped with each other. Further, moistures, etc. are absorbed to the layer. Such a state also hinders contact between each of the atoms in adjacent rods 8.

As has been described above, the surface state on the sides 8a for the respective rods 8 to be brought into contact with each other is different from the ideal state. However, if the side for each of the rod 8 has such a specular finish (e.g. optical flatness) and cleanness as are obtainable by the existing technical level, the sides for the respective rods 8 are joined with a bonding strength at a level of 5 kg/cm² with the effect of hydrogen bond, etc. when they are brought into contact under the normal atmosphere at a room temperature, to thereby obtain an integrated rod assembly 7 comprising Si single crystals. In order to firmly bond the rods 8 together, it is possible to put the rods 8 into the water and bring them in the water into contact with each other or it is possible to wet the surface of each rod 8 with the water before the rods 8 are brought into contact with each other.

Then, the rod assembly 7 as the assembly of each of the rods 8 is heated in a nitrogen atmosphere at about 400° C. for 30 min (step S10). By the heat treatment, adsorbed molecules, mainly, of moisture etc. present in the portion of contact between each of the rods 8 are removed.

Then, the rod assembly 7 is heated in a nitrogen atmosphere at about 600° C. for 30 min (step S11). By the heat treatment, the sides of the respective rods 8 are joined with each other by way of oxygen due to condensating reaction or joined with each other by direct atom bonding of Si atoms.

Then, the rod assembly 7 is heated in a nitrogen atmosphere at 1,000° C. for one hour (step S12). By the heat treatment, the reaction described above takes place more completely. The heating and cooling procedures for the rod assembly 7 are, of course, applied gradually for avoiding undesired effects of stresses.

When the respective rods 8 are assembled in parallel and brought into contact with each other under the normal atmosphere at a room temperature, the respective rods 8 are joined with each other with a bonding strength at a level of 5 kg/cm². By heating the assembly comprising each of the rods 8 in a nitrogen atmosphere in the subsequent step, the respective rods 8 are joined with each other by means of atom bonding with the bonding strength at a level of 100 to 200 kg/cm². Thus, the rod assembly 7 as an integrated comprising Si single crystals is obtained. The value of the bonding strength of from 100 to 200 kg/cm² is at the same level as the tensile strength of Si single crystals. This is evidences demonstrating that the rod assembly, as the assembly comprising the rod 8 is integrated in view of the atom arrangement. If the difference in the direction of crystallographic axes between the sides for the respective rods 8 is within 1 degree, the rod assembly 7 comprises single crystals integrated from a crystallographic point of view. The difference in the direction of the crystallographic axes can be easily retained within the level of 1 degree by the existent technique although "1 degree" is not critical.

Figure 35:
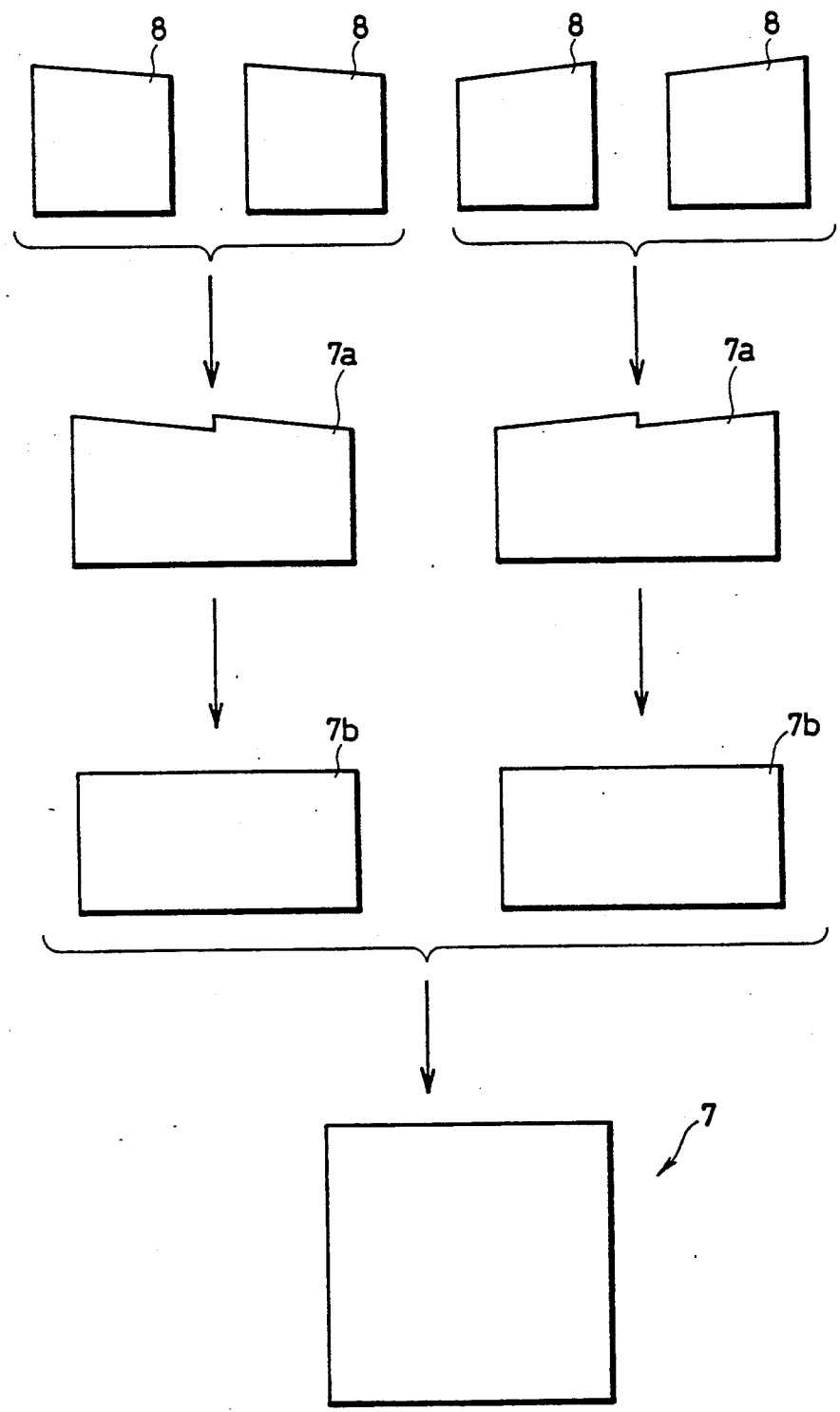
FIG. 35 is a plan view illustrating plural steps for obtaining a rod assembly.

When it is difficult to obtain a rod member 8 having right-angled corners, plural steps as illustrated in FIG. 35 may be performed for finally obtaining a rod assembly.

Then, the rod assembly 7 is sliced to obtain plurality of Si single crystal wafers 9 each of a thickness of several hundreds of micrometers (step S19). This corresponds to the state shown in FIG. 3.

The main surface 10 of the Si single crystal wafer 9 is mirror-finished by means of lapping and polishing (step S14).

A plurality of semiconductor integrated circuits 11 are formed on the main surface of the Si single crystal wafer 9 finished into a mirror face (step S15). The state is shown in FIG. 4.

Description is now made more specifically for the mechanism concerning how the sides for the respective rods 8 are firmly bonded to each other, although it may partially overlap the foregoing explanations.

Ideal State of Si Single Crystal

Figure 8:
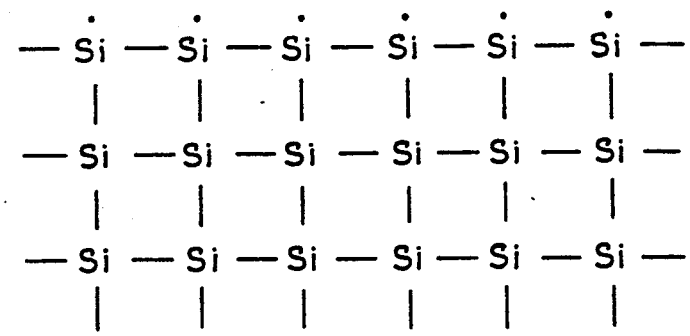
FIG. 8 is a view for the arrangement of atoms, schematically illustrating the state in which the surface of Si single crystals constitute an ideal surface.

If the surface of Si single crystals is in an ideal state, the atom arrangement on the surface takes a structure as shown in FIG. 8, when schematically illustrated in a 2-dimensional view. In this case, if two ideal surfaces are brought into contact with each other, they are directly bonded even at a room temperature from a theoretical point of view. This will be easily understood from the fact that two metal surfaces cleaned and mirror-finished, if urged under pressure, are bonded to each other even at a room temperature. In the drawing, "Si" means Si atoms and "-" means single bond and "." means a radical or potential bond.

Natural Oxide Film Layer of Si Single Crystals

Figure 9:
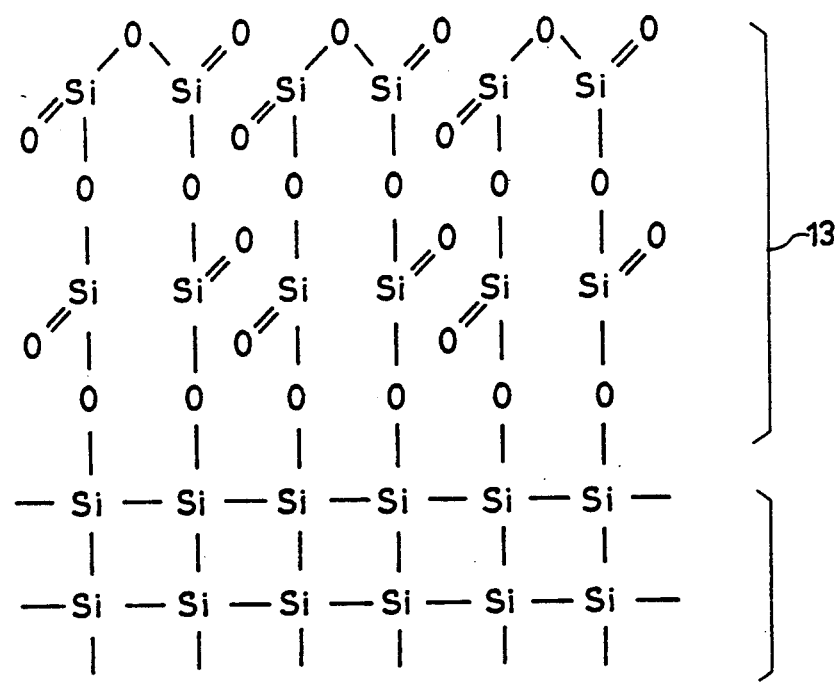
FIG. 9 is a view for the arrangement of atoms, schematically illustrating the state in which natural oxide film layers are formed at the surface of Si single crystals.

The actual surface of Si single crystals, however, does not form an ideal surface even if it is polished physically or chemically into a mirror-finished state. That is, the actual surface of the Si single crystals is covered with a natural oxide film layer comprising several atom layers and the thickness of the film layer is about several tens of angstroms. Such an atom arrangement has a structure as shown in FIG. 9 when schematically illustrated in a 2-dimensional view. In FIG. 9, the portion depicted by the reference numeral 13 is a region of natural oxide film layer, "0" means oxygen atom and "=" means double bond in the drawing.

More specifically, the natural oxide film layer 13 has OH groups on the terminal ends of the Si structure, or it adsorbs water ($H_2O$) by hydrogen bonding. The atom arrangement, when schematically illustrated in a 2-dimensional view, has a structure shown in FIG. 10. In the drawing, the reference numeral 14 denotes hydroxy groups and the reference numeral 15 denotes absorbed water. "H" denotes hydrogen atom and "---" denotes hydrogen bond. The ratio that the terminal end forms OH group or the ratio that it adsorbs water ($H_2O$) by means of hydrogen bond is, of course, effected by the temperature and the humidity under which the natural oxide film layer is formed.

Adsorption of Oils, etc. to Si Single Crystals

Figure 11:
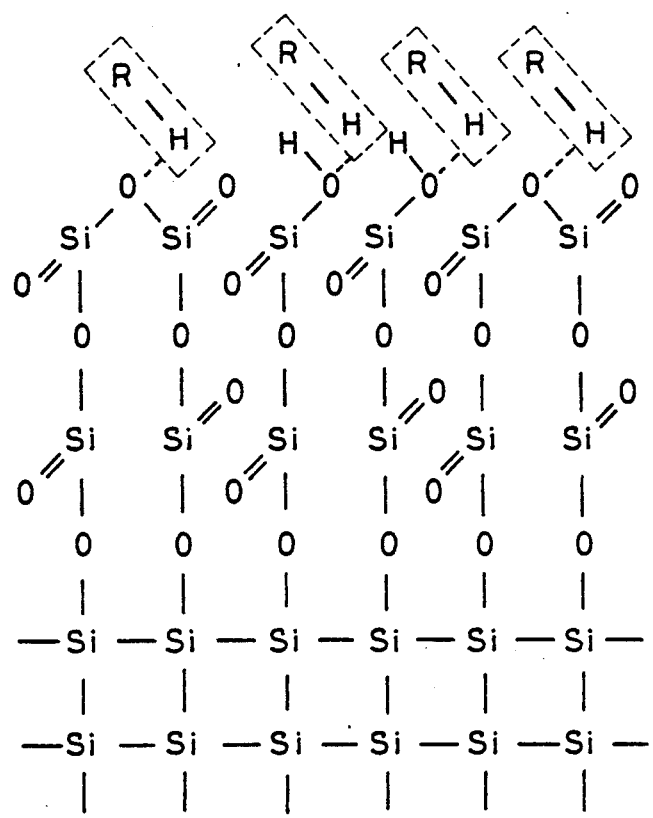
FIG. 11 is a view for the arrangement of atoms, schematically illustrating the state in which organic material such as oil is deposited to the surface of Si single crystals.

Actually, not only dusts are deposited to the surface of Si single crystals placed in a room, but also organic materials such as oils present in air are adsorbed on that surface. The atom arrangement in this state, when schematically illustrated in a 2-dimensional view, has a structure as shown in FIG. 11. In the drawing, "R" represent alkyl group, etc. The surface of the Si single crystals to which organic material such as oils are adsorbed is hydrophobic and repels water. In a case where the surface of the Si single crystals is rendered hydrophobic, two surfaces, when brought into contact with each other, are not bonded even if they are mirror-finished. The reason why Si single crystals having hydrophobic surfaces are not bonded to each other at a room temperature is that the organic material such as oils present at the outermost surfaces have no bonding force between each other.

Removal of Oil, etc. Absorbed on Si Single Crystals

In order to bond the mirror-faces of the Si single crystals with each other at a room temperature, it is not only the dusts deposited to the surface have to be removed but also organic materials such as oils present on the outermost surface have to be removed. As a method of removing the organic materials such as oils deposited to the surface of the Si single crystals, it is desirable to clean the surface of the Si single crystals with an organic solvent in a case where a great amount of such organic materials are present. As the organic solvent, there can be mentioned, for example, chlorine type solvent such as trichlene, dimethyl ethane and carbon tetrachloride, fluorine type solvent such as freon, ketone or alcohol solvent such as acetone or methanol.

As a method of removing organic materials such as oils deposited to the surface of the Si single crystals, the organic materials may be burned to remove by the oxidative effect of heated sulfuric acid. In addition, a method of applying slight etching to the surface of the Si single crystals by means of an aqueous fluoric acid (HF) solution, thereby removing the organic material such as oils deposited to the surface is also effective.

Oil-Free Surface of Si Single Crystals

Figure 10:
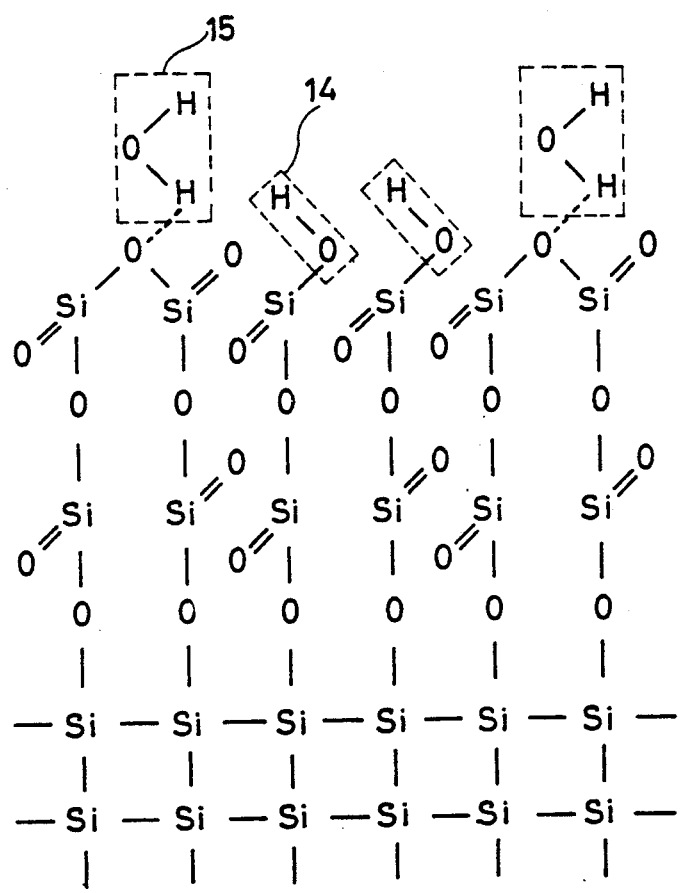
FIG. 10 is a view for the arrangement of atoms, schematically illustrating the state in which water is absorbed to natural oxide film layers shown in FIG. 9.
Figure 12:
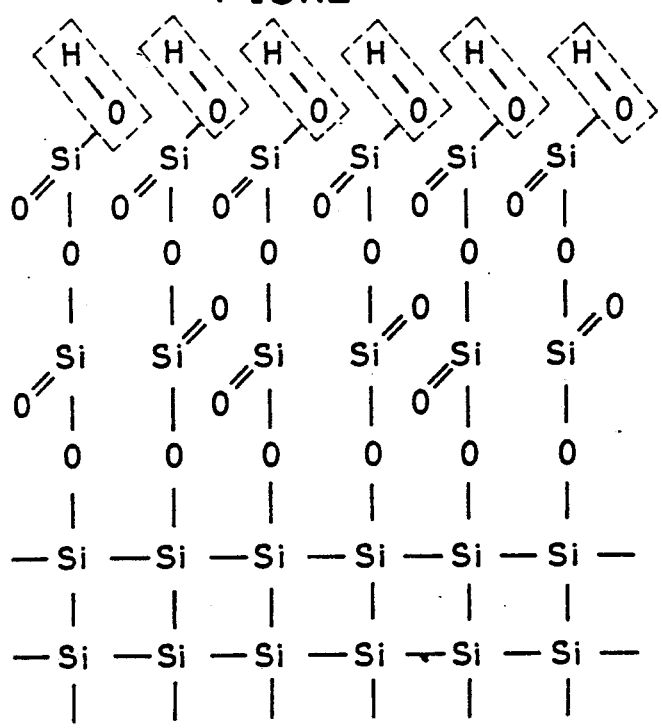
FIG. 12 is a view for the arrangement, of atoms, schematically illustrating the state in which all of the terminal ends of the atoms structure are hydroxy groups at the surface of Si single crystals.

When the organic materials such as oils present on the outermost surface of the Si single crystals are removed, the atom arrangement at the surface, when schematically illustrated in a 2-dimensional view, has a structure as shown in FIG. 10 described above. Further, by treating with an aqueous solution of hydrofluoric acid (HF) and applying water washing, all of the ends in the atom arrangement at the surface portion are basically terminated with hydroxy groups (OH group). In order to increase the hydroxy groups (OH group) at the terminal ends of the surface of the Si single crystals, the surface of the Si single crystals may be treated with an aqueous solution having oxidative effect such as sulfric acid ($H_2SO_4$), nitric acid ($HNO_3$), hydrogen peroxide ($H_2O_2$), etc. followed by water washing. In a case where all of the terminal ends of the atom arrangement at the surface of the Si single crystals are hydroxy groups (OH group), the atom arrangement when illustrated schematically in a 2-dimensional view, takes a structure as shown in FIG. 12.

Figure 13:
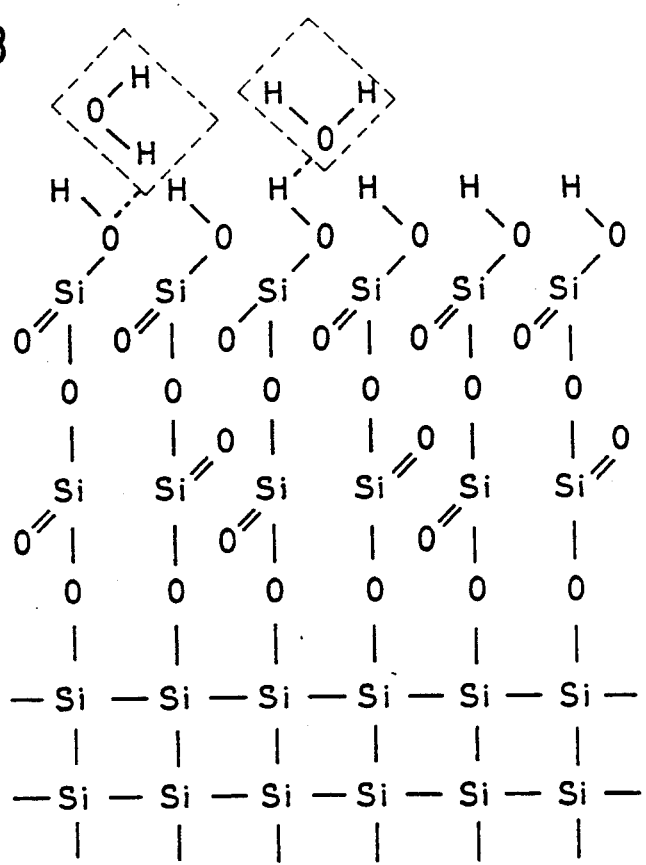
FIG. 13 is a view for the arrangement of atoms, schematically illustrating the state in which water is adsorbed to the terminals of the structure shown in FIG. 12.

Even if all of the ends of the atom arrangement on the surface of the Si single crystals terminated with hydroxy groups (OH group), if the Si single crystals are placed under a wet atmosphere, some water ($H_2O$) is, of course, adsorbed to the surface. The atom arrangement in such a state, when schematically illustrated in a 2-dimensional view, takes a structure as shown in FIG. 13.

Figure 14:
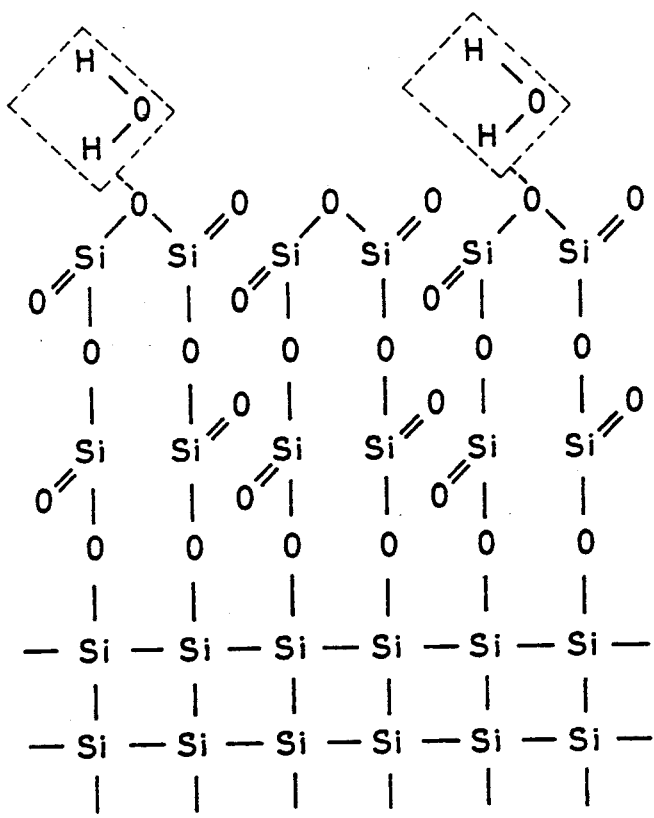
FIG. 14 is a view for the arrangement of atoms, illustrating the state in which dehydrating condensation is taken place between hydroxy groups at the surface of Si single crystals and, subsequently, water is adsorbed to the upper most surface thereof.

As the final treatment, when heat treatment is applied to the surface of the Si single crystals, dehydrating condensation takes place between the hydroxy groups at the surface of the Si single crystals and the atom arrangement on the surface in this case takes a structure as shown in FIG. 9. However, even when the dehydrating condensation is taken place between the hydroxy groups at the surface of the Si single crystals, if the Si single crystals are placed under the wet atmosphere, some water ($H_2O$) is adsorbed to the surface. The atom arrangement in this state, when schematically illustrated in a 2-dimensional view, takes a structure as shown in FIG. 14.

Bonding Mechanism of Si Single Crystals at Room Temperature

When organic materials such as oils are removed from the mirror-finished surface of the Si single crystals, the surface is rendered hydrophilic and easily wettable with water. When the two surfaces of the Si single crystals which are hydrophilic and mirror-finished are brought into contact with each other, there are easily bonded even at a room temperature. The reason why the two hydrophilic surfaces of the Si single crystals are easily bonded with each other at a room temperature is attributed to the hydrogen bond between each of the hydroxy groups (OH group) present at the outermost surface of or the effect of the bonding force due to the hydrogen bond between water adsorbed to the surface. It will be understood easily how the bonding strength of the hydrogen bond is great from the fact that methane ($CH_4$) is gaseous, whereas water ($H_2O$) substantially of an identical molecular weight is liquid at a room temperature.

Figure 15:
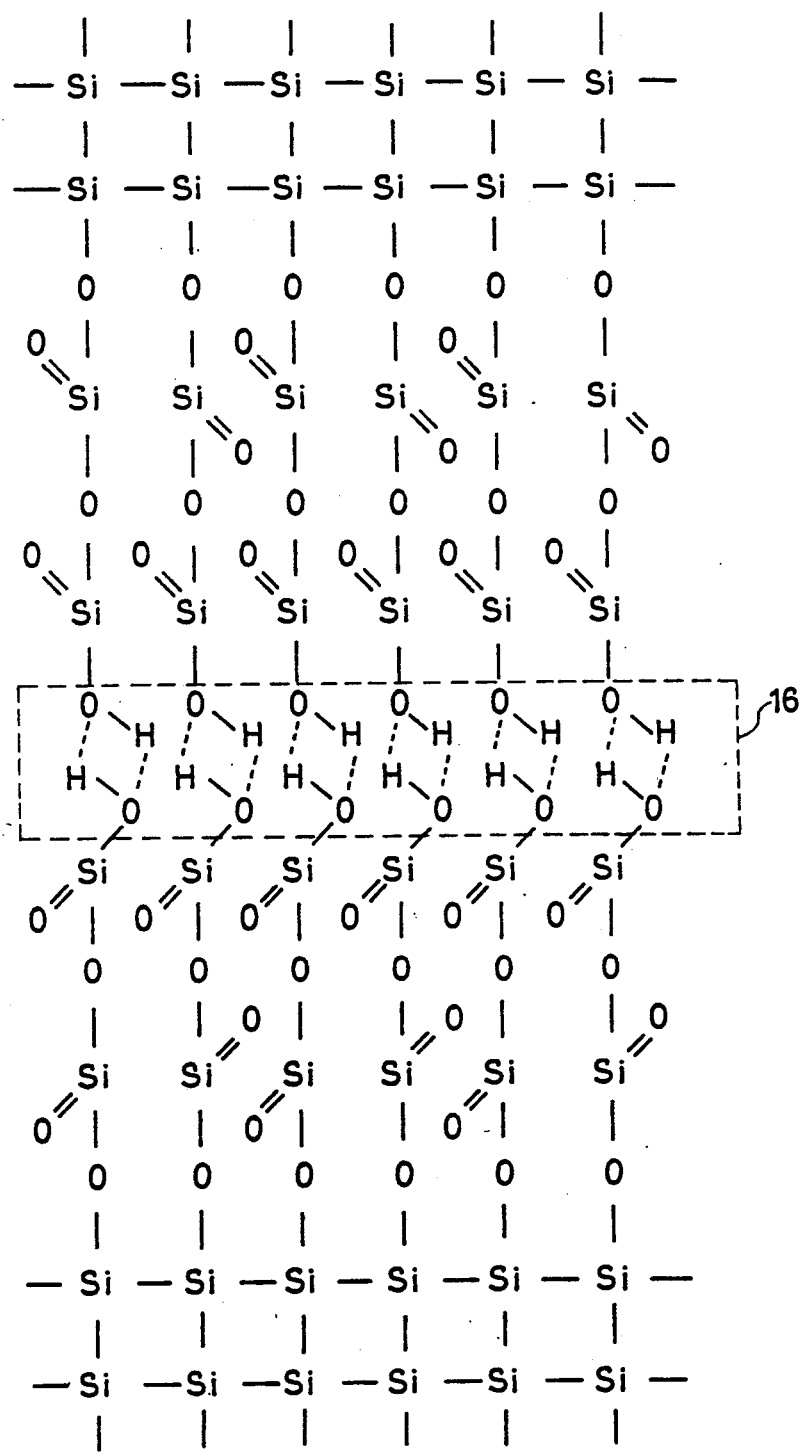
FIG. 15 is a view schematically illustrating the arrangement of atoms in the bonded state in which all of terminal ends of the atom structure are OH groups at the surface of the single crystals.

The atom arrangement in the bonded state in which all of the ends in the atom structure are terminated with hydroxy groups (OH group) at the surface of the Si single crystals, when schematically illustrated in a 2-dimensional view, takes a structure as shown in FIG. 15. In the drawing, the portion depicted by the reference numeral 16 represents the region for the bonded portion.

Figure 16:
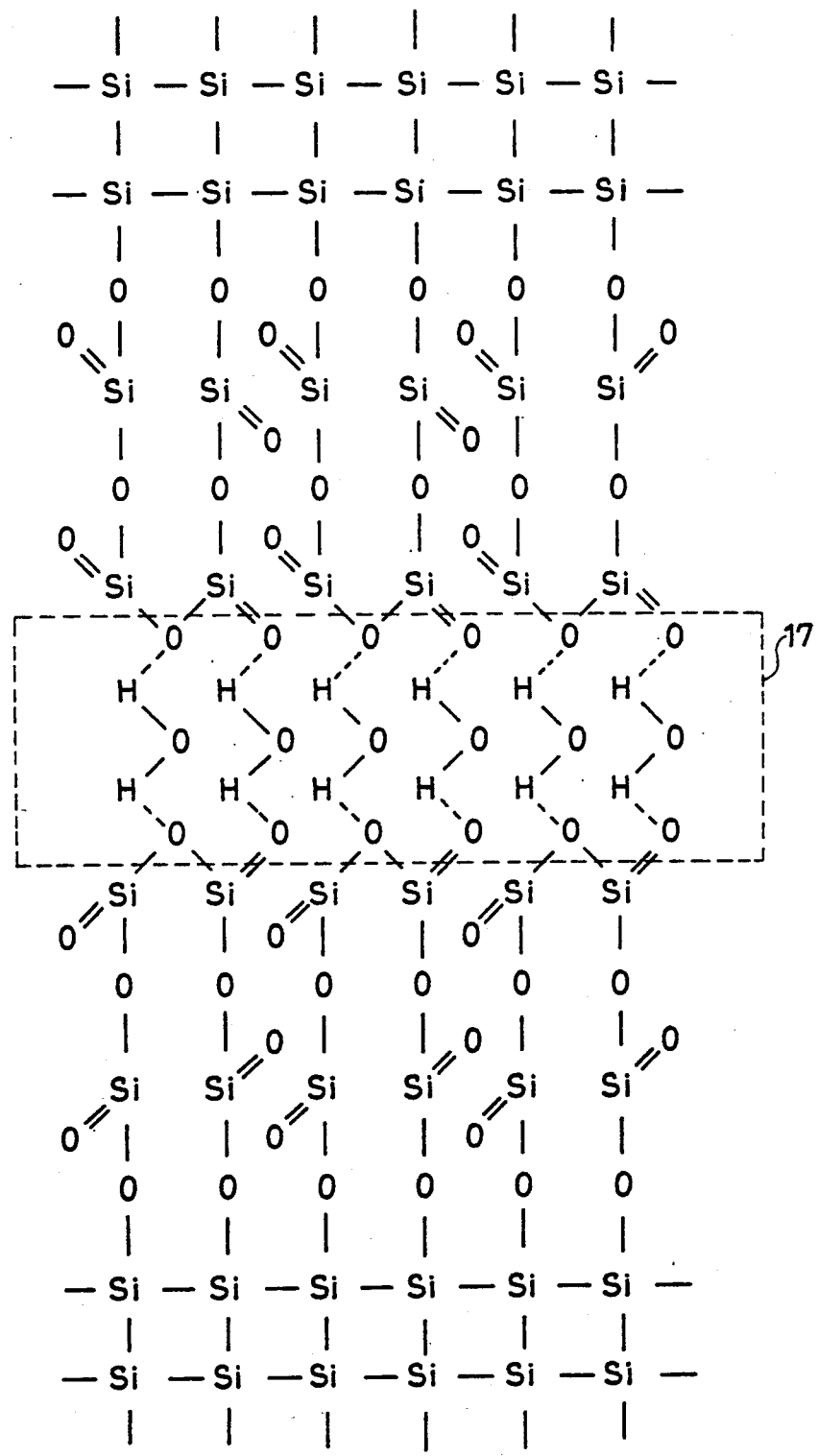
FIG. 16 is a view schematically illustrating the arrangement of atoms in the bonded state in which dehydrating condensation is taken place between hydroxy groups at the surface of Si single crystals and water is adsorbed.

The atom arrangement in the bonded state in which dehydrating condensation is taken place between hydroxy groups (OH group) at the surface of the Si single crystals and water ($H_2O$) is absorbed to that portion, when schematically illustrated in a 2-dimensional view, takes a structure as shown in FIG. 16. In the drawing, the portion depicted by the reference numeral 17 is a region for the bonded portion.

With respect to the bonding due to the hydrogen bonded, the direct bonding between hydroxy groups (OH group) to each other is much stronger than that by way of water ($H_2O$)

Bonding Method of Si Single Crystals at Room Temperature

The two mirror-finished surfaces of the Si single crystals applied with degreasing and cleaning by means of an acid type solution and then washed with water and dried to have hydrophilic property can easily be bonded by merely bringing them into contact with each other. If the Si single crystals are stored for a long period of time in dry atmosphere or excessively heated to dry before contact, hydroxy groups (OH group) at the terminal in the atom arrangement on the surface cause dehydrating condensation. Accordingly, it is not preferred to store them for a long time in dry atmosphere or heat and dry them excessively before contact. In addition, if the Si single crystals are stored for a long time in a room, etc. before contact, oils, etc. in air re-adsorbed to the surface of the Si single crystals, which is not preferred.

When two Si surfaces having hydrophilic surfaces are brought into contact with each other, it is preferred that they are kept in a somewhat wet state, because if there is a gap between the portion of contact of two surfaces of the Si single crystals, the gap-forming portion is bonder by the effect of hydrogen bond of water ($H_2O$) and because this can prevent the adsorption of oils, etc. to the surface of contact. To prevent the adsorption of oils and the like perfectly, it is preferred that Si surfaces are kept in water when two Si surfaces are brought into contact with each other.

After the contact of the two surfaces of the Si single crystals, if the two rods of the Si single crystals are slightly pressed by sliding them to each other in order to remove excess water ($H_2O$) from the surface of contact, bonding between them is more improved. In this case, for avoiding undesired effects due to vibrations, etc., a weight may be applied in addition to the self weight of the rod of the Si single crystal or a pressure may be applied by means of a clamping device, jig, etc.

Bonding Force of Si Single Crystals at Room Temperature

After bonding the two members of the Si single crystals at a room temperature, when the tensile strength is measured, the value varies within a range from 0.5 to 5.0 kg/cm$^2$. If the surface roughness of the mirror-face of the Si single crystals is near 20 nm, the tensile strength takes a value of about 0.5 kg/cm$^2$. On the other hand, if the surface roughness for the mirror-face of the Si single crystals is from 5 to 10 nm, the value of the tensile strength is about from 3.0 to 5.0 kg/cm$^2$. The surface roughness for the mirror-face of the Si single crystals can be sufficiently reduced to about 2 nm by the existent technical level. Accordingly, there is no problem for the surface roughness of the mirror-face.

It is considered that the reason why the tensile strength varies as described above is attributable to the fact that the bonding between hydroxy groups (OH group) to each other by means of the hydrogen bonding is not present over the entire surface of the Si single crystals. In other words, if the hydroxy groups (OH group) are bonded to each other by means of the hydrogen bond over the entire surface of the Si single crystals, it is considered that the tensile strength takes a value at a level of 5 kg/cm$^2$.

Bonding Force of the Si Single Crystals by Heating

When the rod of the Si single crystals bonded to each other at a room temperature are heated in a nitrogen ($N_2$) atmosphere, the tensile strength is increased. The tensile strength starts to increase abruptly at a temperature in excess of 200° C. When the tensile strength is measured after heating the rods of the Si single crystals bonded to each other at room temperature in a nitrogen atmosphere at 400° C., a value of about 50 kg/cm$^2$ is obtained. The tensile strength is saturated (e.g. exhibits a substantially constant value) within a range of the heat temperature from 400° to 800° C. If the rods of Si single crystals bonded to each other are heated in a nitrogen atmosphere at a temperature in excess of 800° C., the tensile strength starts to increase further abruptly. If the temperature strength is measured after heating the rods of the Si single crystals bonded to each other in the nitrogen atmosphere within the temperature range from 1000° C. to 1200° C., a value from 100 to 200 kg/cm$^2$ is obtained. In this case, destruction of the boundary is caused in the bulk of the Si single crystals, and the value of the tensile strength of 100 to 200 kg/cm$^2$ is at an identical level for the tensile strength of the Si single crystals It is to be understood that it is possible to form an integrated body like as a single crystal. In the meanwhile, the tensile strength is sufficient to withstand the slicing force at the slicing process.

Bonding Mechanism of the Si Single Crystals by Heating

It is considered that the tensile strength starts to increase abruptly when the heating temperature exceeds 200° C., because hydroxy groups (OH group) starts to take place dehydrating condensation to each other on the surface of contact of the rods of the Si single crystals. Namely, it is considered that the hydrogen bonding between the hydroxy groups (OH groups) to each other starts to change to the bonding of Si—O—Si.

It is considered that the tensile is saturated within the range of the heating temperature of from 400° C. to 800° C., because there is a balance between the increase of the void due to water ($H_2O$) formed by the dehydrating condensation and the increase in the Si—O—Si bonding.

Figure 17:
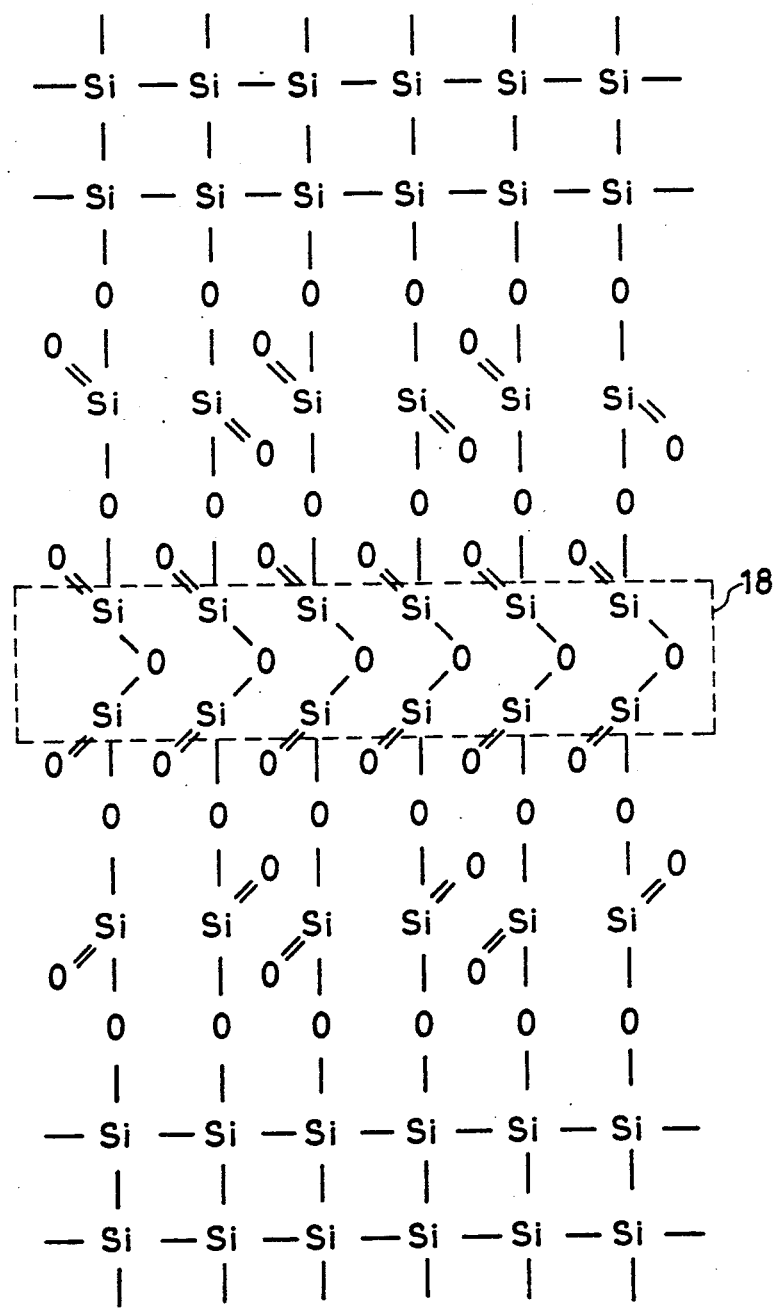
FIG. 17 is a view for the arrangement of atoms illustrating a state in which dehydrating condensation is completed at the bonded portion.

The tensile strength starts to increase further abruptly if the heating temperature exceeds 800° C., because the voids start to decrease and the effect of increasing the Si—O—Si bonding becomes predominant. It is considered that the value of the tensile strength is settled to 100–200 kg/cm$^2$ when the heating temperature reaches 1000° C.–1200° C., because the dehydrating condensation is completed. The atom arrangement in a state where the dehydrating condensation is completed, when illustrated schematically in a 2-dimensional view, takes a structure as shown in FIG. 17. In this drawing, the portion shown by the reference numeral 18 denotes a region for the bonded portion.

Bonding Method of Si Single Crystals by Heating

Basically, when the rods of the Si single crystals bonded to each other at a room temperature are heated in a nitrogen atmosphere at a temperature from 1000° C. to 1200° C. for about 2 hours, substantially complete bonding can be obtained. Upon heating and cooling, it is necessary to apply gradual heating and cooling at such a rate that no crystal defects are formed in the Si single crystals. It is desirable that the heating rate to the rods of the Si single crystals bonded to each other is such that the rods of the Si single crystals are at first maintained at a temperature from 200° C. from 400° C. for about 30 min. to one hour and, thereafter, maintained at a temperature of 400° C. to 800° C. for about 30 min. to one hour, in order to prevent abrupt occurrence of voids.

As the heating atmosphere, a nitrogen atmosphere may be used in a case where the flatness at the mirror-surface of the Si single crystals is satisfactory, but it is desirable to mix oxygen into nitrogen or mix steam and oxygen into nitrogen for making more reliable bonding over the entire mirror-finished surface of the Si single crystal.

During the heat treatment, a weight may be added in addition to the self-weight of the rod members of the Si single crystal, or a pressure may be applied by means of clamping jig, in order to prevent undesired effects caused by vibrations, etc.

Filling of the Gap between the Surfaces of Contact of Si Single Crystals

In case where the flatness is poor for the mirror-finished surface of the rods of the Si single crystals, since there are portions not in contact with each other from a macro point of view, there may be sometimes formed such surfaces as not bonded with each other. The gap in the surfaces of non-contact caused by the insufficiency of the flatness is compensated by the oxidative volume expansion of Si, that is, volume expansion by the change: Si>SiO$_2$, by which the surfaces are brought into contact with each other. Oxidation of Si is caused by water formed in the dehydrating reaction or by water or oxygen introduced into the heating atmosphere.

It is desirable that the flatness for the mirror-finished face of the rods of the Si single crystals is less than 10 $\mu$m. However, in an actual case, the allowable deviation from flatness is different also depending on the heating atmosphere, the heating temperature conditions and the heating time. On the contrary, the tolerance of allowable flatness is not affected by the chemical treatment or an applying force.

Figure 18:
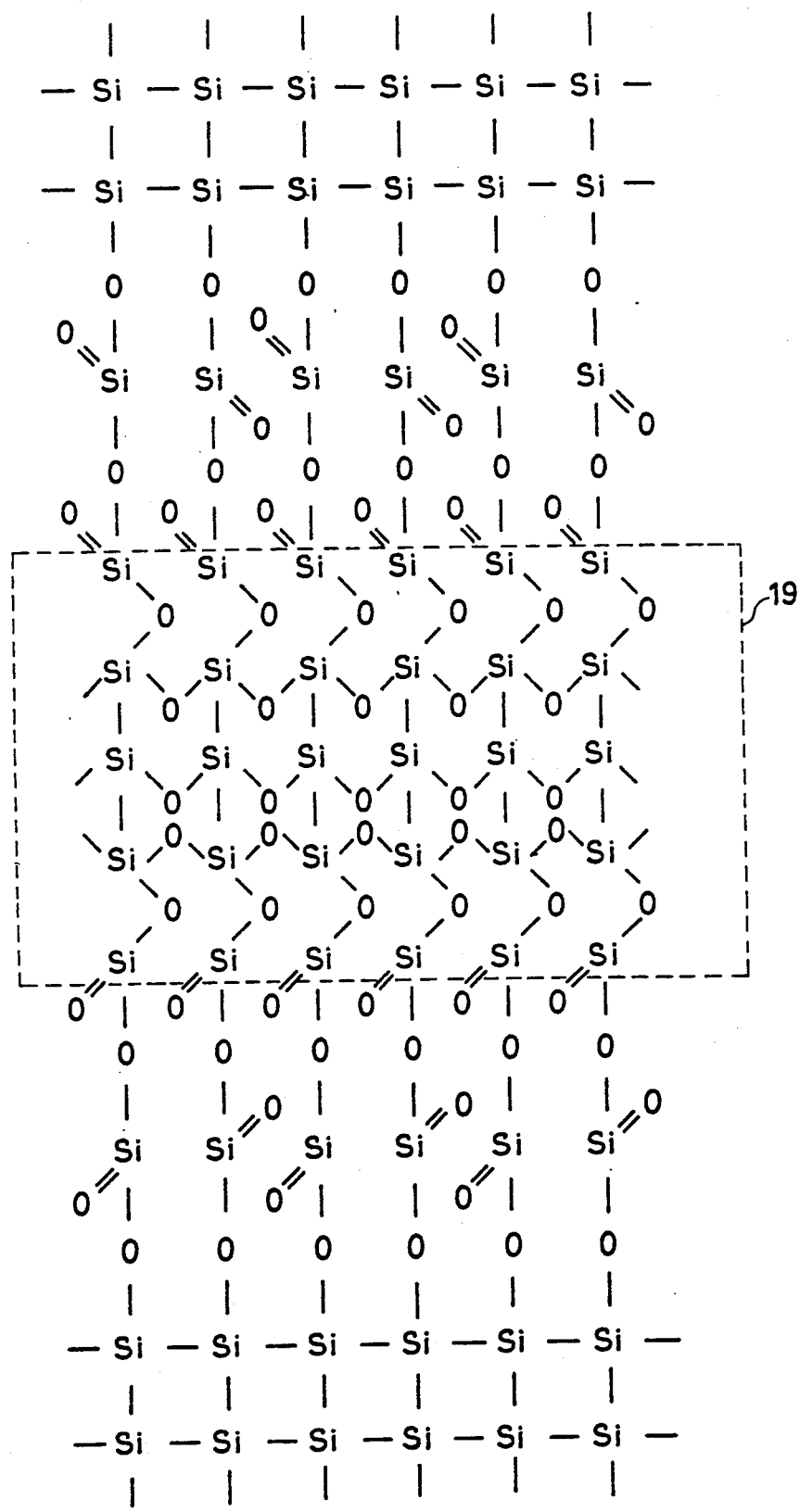
FIG. 18 is a view for the arrangement of atoms schematically showing the state in which silane type organic materials are intervened for contact.

As a method of compensating the non-contact surface caused by the poor flatness, the gap may be filled with silane type organic material having terminals capable of condensating reaction in the atom arrangement. While the silane organic materials are bonded to each other by means of hydrogen bond at a room temperature, they are condensated by heating to introduce Si—O—Si bonding or Si—Si bond into the gap between the non-contact surfaces. In the case of filling the silane organic material, it is required to restrict the amount as low as possible so as not to give undesired effect on the direct mirror-finished contact surfaces. The atom arrangement upon introducing the silane type organic material, when schematically illustrated in a 2-dimensional view, takes a structure, for example, as shown in FIG. 18. In the drawing, the portion depicted by the reference numeral 19 is a region for the bonded portion.

Then, the advantageous effect of the embodiment according to the present invention is to be explained referring to FIG. 1 through FIG. 4.

The rod assembly 7 comprises four rods 8 assembled in parallel and connected with each other into an integrated body. The area of the wafer 9 obtained by slicing the rod assembly 7 has an area four times as large as that of the wafer obtained by slicing one rod 8. As has been described above, the diameter of the Si single crystal wafer has been determined depending on the diameter of the single crystal ingot. In view of the production technique for the single crystal ingot, the maximum diameter of the Si single crystal wafer is 6 inch at the mass production level. On the other hand, the maximum diameter of the Si single crystal wafer is 10 inch at the trial level. In the embodiment of the present invention, however, since the wafers 9 are obtained by assembling the four rods 8 formed from single crystal ingots into an integrated circuit body and then slicing the rod assembly 7 as the integrated body therefrom, it is possible to obtain a wafer of such a great diameter as can not be produced so far. In addition, Si single crystal wafers of such great area car be obtained at a relatively reduced cost.

Figure 21:
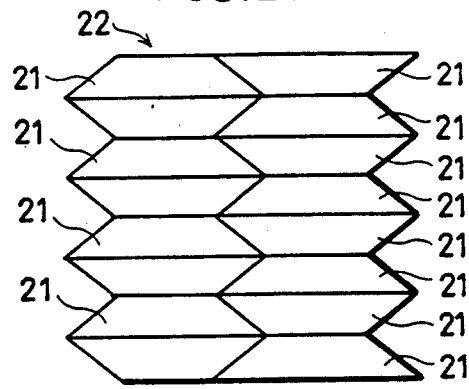
FIG. 21 is a plan view for a state in which a plurality of rods each of a trapezoidal cross sectional shape shown in FIG. 19 are assembled into an integrated body.
Figure 24:
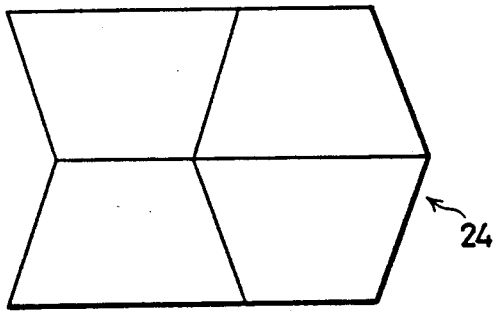
FIG. 24 is a plan view illustrating a rod assembly prepared by using the ingot shown in FIG. 23.
Figure 28:
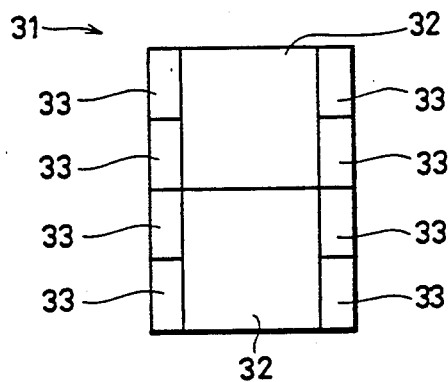
FIG. 28 is a plan view illustrating a still further embodiment of the rod assembly.

The rod assembly 7 of the Si single crystal having a great cross sectional area is sliced and, further, by way of the steps such as lapping and polishing, Si single crystal wafer 9 of a great area is prepared. These steps basically comprise a plurality of divided steps operated on every surfaces. Accordingly, when comparing the case of preparing a plurality of the Si single crystal wafers each of a small area and the case of preparing one Si single crystal of such a great area as having the identical area with that of the total area for the plurality of wafers, the cost per area is possibly reduced in the case of the Si single crystal wafer 9 of a large area, with the reason as described below. In a case of arranging a plurality of rods 8 in parallel and connecting them with each other into an integrated body, cutting, lapping, polishing, cleaning, heating and similar other steps are added for the connection. The added steps are not necessary in the case of producing a wafer from one Si single crystal ingot and the cost is increased by so much in the case of arranging a plurality of rod members 8. On the other hand, regarding the slicing, lapping, polishing and similar other steps required for preparing wafers from the rod, more cost reduction can be obtained in a case where a plurality of rod members 8 are assembled into an integrated circuit body. That is, if the rods 8 are separately prepared, steps of slicing, lapping, polishing and similar other steps are necessary to each of the rods for preparing the wafers respectively. On the other hand, in a case of a rod assembly comprising a plurality of rods 8 assembled together, it is only necessary for applying slicing, lapping and polishing to one rod assembly 7 for preparing wafers. Taking the steps from the rods to the production of wafers into consideration the embodiment of the present invention can provide remarkable reduction in the cost. From an overall point of view, reduction in the cost obtained by manufacturing wafers by fabricating the rod assembly as an assembly of a plurality of rod members is predominant over the increase in the cost required for assembling plurality of rods. That is, from an overall point of view, the embodiment of the present invention ca provide reduction in the cost. The effect of the cost reduction becomes greater as the number of the assembled rods 8 is increased (e.g. to 9, 16, 25 etc. or other numbers as shown in FIGS. 21, 24 and 28).

As shown in FIG. 4, a plurality of semiconductor integrated circuits 11 are formed on the main surface 10 of the Si single crystal wafer 9. It is apparent that the number of the semiconductor integrated circuits to be formed on the wafer 9 is increased as the area of the wafer 9 is greater. In the production field for semiconductor integrated circuits, a plurality of identical circuits can basically be manufactured by using photolithography technique. Accordingly, the production cost for one identical circuit constitution can be reduced outstandingly as compared with individual production of each one circuit. The effect of the cost reduction becomes increased as the number of the semiconductor integrated circuits 11 that are formed simultaneously is increased. Accordingly, the production cost per one identical circuit constitution is reduced as the area of the Si single crystal wafer 9 is greater.

In the production of a semiconductor integrated circuit, the Si single crystal wafer is processed on a single wafer or on a plurality of wafers at a time in the steps before and after the photolithography step. Accordingly, as the area of the Si single crystal wafer 9 is increased, more identical circuits can be manufactured at the same time, thereby enabling reduction of the production cost per one identical circuit constitution of the semiconductor integrated circuit. These steps can include, for example, an epitaxial step for making crystals grow on a Si single crystal wafer, an ion implantation step for introducing impurities into the single crystal wafer and a diffusing step subsequent thereto, an oxidizing step or CVD step for selectively introducing impurities or protecting the bonded surface, a metallizing step for forming electrodes or wiring layers, etc. These steps are applied on every single crystal wafers or on every lots of single crystal wafers.

As has been described in the embodiment of the present invention, since the Si single wafer of a relatively large area is used, and a plurality of semiconductor integrated circuits 11 are formed at a same time on the main surface thereof, the cost per one semiconductor integrated circuit 11 can be reduced. Generally, the cost for semiconductor integrated circuit comprises design cost, material cost, fabrication cost, managing cost, etc. In the products of exclusive use, while the design cost, the managing cost, etc. are relatively increased, they are generally utilizable, whereas the design cost, managing cost, etc. are relatively lower in the case of mass-produced products. As has been described above, the effect of reducing the fabrication cost in the embodiment of the present invention is particularly remarkable for the products having general utilizability and mass-produced, for example, main semiconductor integrated circuits such as memories of large capacity.

The reason why the semiconductor integrated circuit industry is called a plant industry is that the production facilities are expensive. Particularly, facilities in the steps for wafer processing are expensive. Wafer processing steps at present will give an impression as if they are laboratories rather than factories, because the maximum diameter for the Si single crystal wafers that are put to practical use at present is at a level of 0.15 m and the area is too small to be used as the material for the mass-production in factories. However, in the embodiment as described above, the area of the Si single crystal wafer can be increased, theoretically, with no limit. For instance, it is possible to prepare a square-shaped Si single crystal wafer with 1.0 m length for one side.

There is a remarkable difference in the cost between a semiconductor integrated circuit formed by using a Si single crystal wafer with the maximum diameter of 0.15 m and a semiconductor integrated circuit formed by using ar Si single crystal wafer with the length for one side of 1.0 m. In the embodiment according to the present invention, although such a remarkable effect can be attained, more accurate control is not required as a rule to the production step. That is, what is relevant to the increase in the area of the Si single crystal wafer is a problem of mechanical strength, as well as uniformity of the area from optical, thermal and fluidic point of view regarding the wafer. However, there are problems of industrial principle concerned with the scaling up, which can be overcome by skillfully devising the structure of the production facilities.

In the embodiment described above, since the rods 8 are prepared by using Si single crystal ingots of the same size as those produced so far, and the rods 8 are assembled in parallel to form a rod assembly 7 which is then sliced to produce a Si single crystal wafer of a greater area, production facilities for the Si single crystal ingots used so far can be employed successively without discarding or obsolescence. That is, even when the increase in the area of the Si single crystal wafers has been progressed rapidly, production facilities used so far for the Si single crystal ingots are not wasted. Accordingly, increase in the area of the Si single wafers imposes not so large burden on Si wafer manufacturers. In summary, what hinders the attainment to the increase in the area of the Si single crystal wafers is only the problem of mechanical strength, as well as a problem for the uniformity of the area from optical, thermal and fluidic point of view regarding the wafer. Since these problems can be easily overcome by making improvement to the structure of the production facilities, increase in the area of the Si single crystal wafer can also be realized easily.

In the embodiment described above, if the number of the rods 8 to be assembled is increased, increase in the area of wafers can progress not little by little, but all at once and remarkably, upon undertaking the increase in the area of the Si single crystal wafer and, accordingly, the production facility for semiconductor integrated circuits can be modified, not little by little, but at all once. That is, the efficiency of investment for the production facilities can remarkably be improved It is, for example, apparent that the facilities and the steps for producing semiconductor integrated circuit by using Si single crystal wafers of maximum diameter of 0.15 m and the facilities and the steps for producing semiconductor integrated circuits using Si single crystal wafers with the length for one side of 1.0 m are different greatly from each other.

Although explanation has been provided in the foregoing embodiment to a case where semiconductor integrated circuits are formed on a wafer, the present invention may be applicable to other application uses. That is, if the present invention is applied to such a use that a plurality of electronic devices are formed simultaneously on a wafer, the cost for manufacturing the electronic devices will be reduced. As individual semiconductor devices other than semiconductor integrated circuits, there can be mentioned, for example, transistors, diodes thyristors, etc. to which the present invention is also applicable. Furthermore, the present invention is also applicable to other electronic devices than the semiconductor devices, for example, resistance elements, and arrays, decoder, LED's and arrays, capacitance elements, sensors, etc.

In the foregoing embodiment, although explanation has been made to a case where the Si single crystal rods 8 are connected with each other, the same process mentioned can be employed also to a case of connecting Si polycrystal rods to each other. In the case of using Si polycrystal rods, there can be considered such application examples, for instance, that the surface of the wafer after the formation is made into a single crystals by means of laser annealing technique, which is used instead of the Si single crystal wafer. Annealing is carried out to obtain a single crystal on the entire surface of the wafer.

This technique can be applied to materials other than Si as well as the case of using Ge single crystal rods or Ge polycrystal rod members, each of the rods can be assembled to each other into an integrated body in the same method. In the case of using the Ge single crystal rods or Ge polycrystal rods, however, rods are connected with each other not by means of Si—O—Si bond but Ge—O—Ge bond. Further, since the melting point of Si is 1412° C., the rod of Si crystal can be heated to a temperature of 1200° C. On the other hand, since the melting point of Ge is 958.5° C., the heating temperature upon heating the Ge crystal rod should not exceed 900° C.

It is also possible to assemble and bond a plurality of rods comprising single crystals or polycrystals of compound semiconductors such as GaAs, InP and CdS, or to assemble and bond a plurality of rods comprising oxides such as quartz ($SiO_2$) or sapphire ($Al_2O_3$) with each other. In the case of the compound semiconductor, however, since decomposition may possibly be caused upon heating the rod, it is necessary that the temperature is set as low as possible. Furthermore, it is also necessary to apply a treatment for sufficiently oxidizing or hydroxidizing the surface of the rod.

As has been described above, even in the case of bonding Si single crystal with each other, this is the bonding between $SiO_2$ with each other by means of natural oxide film layers from a micro point of view. Accordingly, $SiO_2$ may be deposited intentionally on the rod of the Si single crystal and, thereafter, Si single crystal rod may be bonded to each other by means of $SiO_2$. Various methods can be selected for depositing $SiO_2$. For instance, the rod of Si single crystals may be heated in a wet oxygen atmosphere ($H_2O + O_2 + N_2$) at 900° C., thereby depositing oxide film layers of 0.5–2 $\mu m$ thickness to the surface of the rods. Further, oxide film layers may be deposited to the surface of the rods by using the thermal decomposing method of silane type compound ($SiH_4 + O_2$ or $Si(OC_2H_5)_4$, etc.). Alternatively, oxide film layers of about 0.5–2 $\mu m$ may be deposited to the surface of the rod by a so-called CVD process.

The chemical treatment and heat treatment after intentionally depositing $SiO_2$ to the surface of the rods of Si single crystal is the same as in the case of bonding the rod members of Si single crystals with each other. Although the rods are more readily bonded with each other by intentionally depositing $SiO_2$ to the surface of the rods of Si single crystals, if the thickness of the oxide film layer is too great, it reduces the effect of compensating the gap at the surface of contact due to oxidation expansion of Si. Accordingly, excess increases in the thickness of the oxide film layers should be avoided.

A plurality of rods of Si single crystals may be bonded with each other by way of Si polycrystals. Si polycrystals can be deposited to the surface of the rods of Si single crystals by means of thermal decomposition of silane ($SiH_4$). The deposited Si polycrystals provide an effect of moderating stresses.

It is also possible to bond a plurality of rods of polycrystals by means of intentionally deposited $SiO_2$.

Also, rods comprising Ge crystals, rod members comprising various compound semiconductors, rods comprising oxides, etc. can also be bonded with each other by way of materials different from that of such rods. For instance, it is possible to deposit oxide film layers to the surface of rods of GaAs single crystals by various methods. The rods of GaAs single crystals are heated to a temperature from 350° to 500° C. in a dry or wet atmosphere. The rods of GaAs single crystals are oxidized at such a low temperature, for preventing as dissociation. Oxides formed on the surface of the rods of GaAs single crystals are $Ga_2O_3$. When rods of GaAs single crystals are heated in an $As_2O_3$ atmosphere, $As_2O_3$ can also be obtained as oxides. The surface of rods of GaAs single crystals may be anodically oxidized by immersing them into an aqueous solution of $NH_4B_5O_8$, an aqueous 1% solution of $HPO_4$, an aqueous 3% solution of $H_3BO_4$, an aqueous 30% of $H_2O_2$, etc.

A plurality of rods of GaAs single crystals may be bonded with each other by way of silicon nitride ($Si_3N_4$). In this case, silicon nitride ($Si_3N_4$) has an effect of preventing As dissociation under a high temperature.

For instance, $Si_3N_4$ is deposited to the surface of the rods of GaAs single crystals by means of CVD process (by thermal decomposition of $SiH_4 + NH_3$). Since there is no bonding force between each of $Si_3N_4$, polycrystalline Si is further deposited on the deposition layer of $Si_3N_4$ by means of CVD process (by way of thermal decomposition of $SiH_4$). Then, $SiO_2$ is deposited to the polycrystalline Si deposition layer by means of CVD process (by way of thermal decomposition of $SiH_4 + O_2$ or $Si(C_2H_5)_4$). The subsequent chemical treatment and the heat treatment are the same as those for the rods of Si single crystals described above. However, since tle melting point of GaAs is 1238° C., it is desirable that the heating does not exceed 1000° C.

In the method as described above, aluminum oxide ($Al_2O_3$) may be deposited, instead of silicon nitride ($Si_3N_4$), by means of CVD process (by way of thermal decomposition of $Al(OC_3H_7)_3$). Further, although there is some problem of As dissociation at a high temperature, Si polycrystals may directly be deposited to the surface of the rods of GaAs single crystals, or $SiO_2$ may be deposited directly if the flatness at the surface is satisfactory.

Although the explanation has been made to a case of connecting a plurality of rods comprising identical material with each other, a plurality of rods comprising different material may be assembled in parallel and connected with each other into an integrated body. For instance, it is also possible to bond rods comprising Si single crystals and rods comprising GaAs single crystals with each other by the similar method. In this case, Si may be deposited to the outermost surface of the rods of GaAs single crystals.

In a case where a plurality of rods are completely bonded by way of a small amount of oxygen ($O_2$) in a micro point of view, since oxygen ($O_2$) is diffused in the bulk, the bonding interface between the rods forms complete crystals. However, since excess oxygen intervenes between the portions of contact of a plurality of rods for compensating the poor flatness and the surface roughness at the surface of the rod, the bonding interface does not form complete crystals. Even if the bonding interface does not form completely crystals, that is, if joint portions are present in a complete wafer and the joints portions do not form complete crystals, there are no problems so long as they are firmly bonded mechanically with each other. For instance, even if joints of incomplete crystals at an order of several tens of angstrom to micrometer order are present in a complete wafer, this cause no much trouble in a case of forming a plurality of identical patterns on a wafer.

Figure 19:
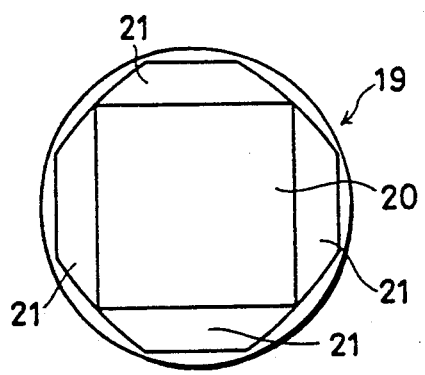
FIG. 19 is a plan view illustrating a state capable of taking out a plurality of rods of different shapes from one ingot.
Figure 20:
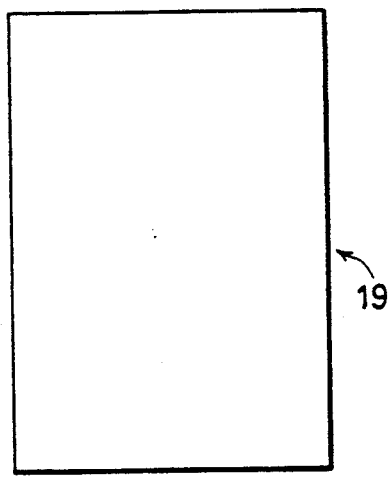
FIG. 20 is a front elevational view of FIG. 19.
Figure 22:
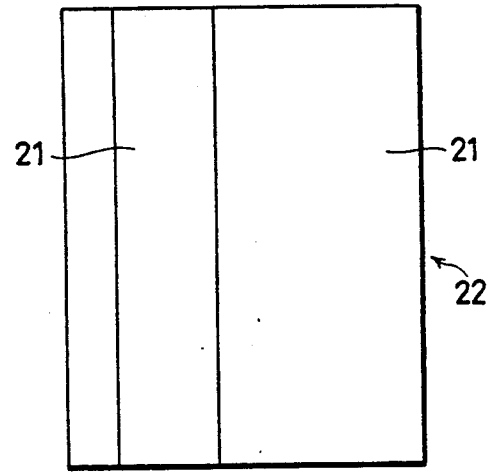
FIG. 22 is a front elevational view of FIG. 21.

In the embodiment shown in FIG. 1 and FIG. 2, although each of the rods 8 to be assembled with each other, has a square prism shape, it is not necessarily limited to such a shape. Referring to FIG. 19 and FIG. 20, an ingot 19 is divided into one rod 20 having a square cross sectional shape and four rods 21 each having a trapezoidal cross sectional shape. As shown in FIG. 21 and FIG. 22, it is also possible to assemble and connect a plurality of rods 21 each having a trapezoidal cross sectional shape, after taken out from the ingot 19, with each other into one rod assembly 22. By the method as shown in FIG. 19 through 22, the efficiency for utilizing material can be improved.

Figure 23:
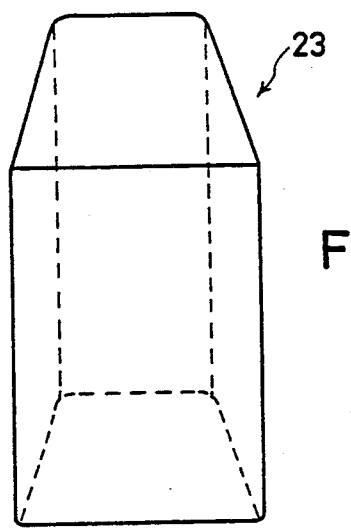
FIG. 23 is a perspective view illustrating an ingot of a trapezoidal cross sectional shape.
Figure 25:
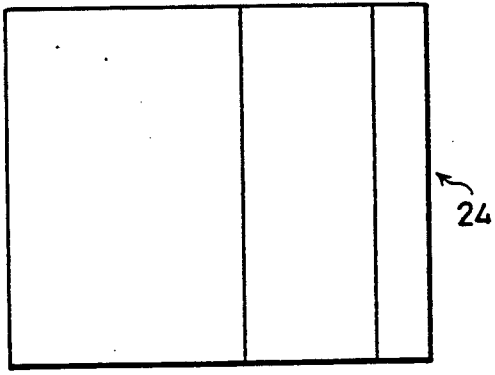
FIG. 25 is a front elevational view for the rod assembly shown in FIG. 24.

It is also possible to utilize an ingot 23 having a trapezoidal cross sectional shape as shown in FIG. 23. For instance, a GaAs ingot prepared by a Horizontal Bridgeman method (HB method) forms a rod having a trapezoidal cross sectional shape as shown in FIG. 23. By shaping such an ingot 23, and assembling the thus formed rods in parallel, thereby preparing a rod 24 as shown in FIG. 24 and FIG. 25, the efficiency of utilizing material can be improved.

Figure 26:
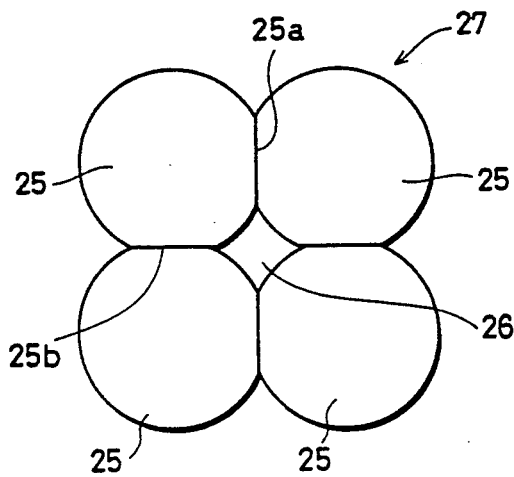
FIG. 26 is a plan view illustrating another embodiment of the rod assembly.
Figure 27:
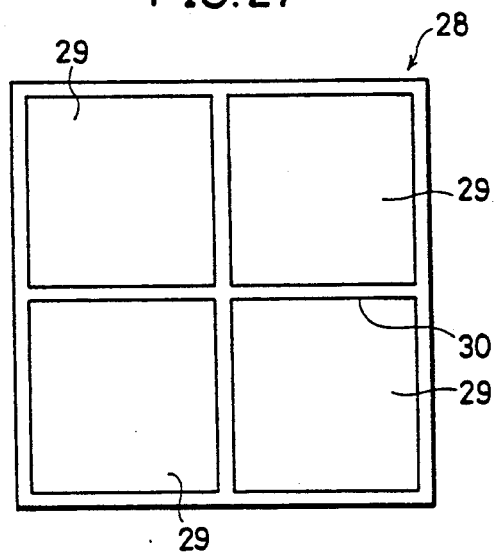
FIG. 27 is a plan view illustrating a further embodiment of the rod base material.

It is not always necessary that the rods to be assembled is in a square prism shape. That is, the rod has any configuration so long as it has a bonded face extended in the longitudinal direction thereof and finished into a mirror-face state. For instance, in an embodiment of FIG. 26, a rod member 25 is substantially of a circular cylindrical shape having two bonded faces 25a, 25b. When four rods 25 are assembled in parallel and connected with each other to prepare a rod assembly 27, a cavity 26 is formed at the central portion thereof. The embodiment shown in FIG. 26 can increase the efficiency of using material and also provide a effect of moderating internal stresses caused at the inside of the rod assembly 27. A rod assembly 28 shown in FIG. 27 comprises Si single crystals, in which four square prism rods 20 each having a square cross sectional shape are assembled and connected with each other into an integrated body. The respective rods 29 are connected with each other by way of SiO2 film layers 30 intervening at the bonded faces. The material intervening between each of the rods is not restricted only to the oxides of the rod. For instance, nitrides or polycrystalline body of the rod may be intervened Otherwise, single crystals, polycrystals, oxides, nitrides, etc. of materials different from that of the rod may be intervened.

The rod assembly 31 shown in FIG. 28 comprises rods prepared from different material which are assembled in parallel and connected with each other into an integrated body. Specifically, the rod assembly 31 comprises two Si single crystal rods 32 and eight GaAs single crystal members 33 which are assembled in parallel into an integrated body. In this embodiment, it is possible to constitute a composite IC circuit having an Si substrate portion and a GaAs substrate portion with one chip.

Figure 29:
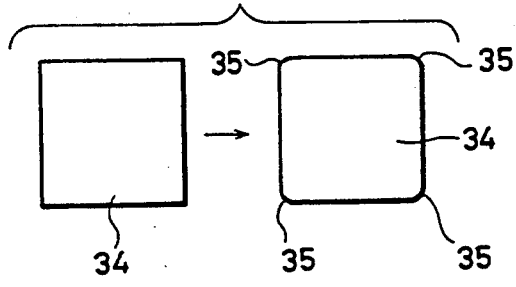
FIG. 29 is a plan view illustrating rods to be assembled subsequently.
Figure 30:
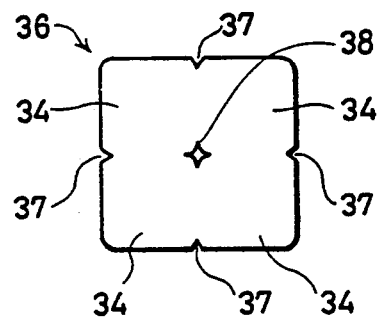
FIG. 30 is a plan view illustrating a rod assembly obtained by assembling four chambered rods shown in FIG. 29.

As shown in FIG. 29, if each of the rods 34 to be assembled is of a square prism shape, corners thereof may be chamfered as shown by the reference numeral 35. FIG. 30 shows a rod assembly 36 comprising four such chamfered rods 34 assembled in parallel into an integrated circuit body. Since the corners 35 of the rod member 34 are chamfered, recesses 37 and a cavity 38 are formed at the bonded portions for the respective rods 34. In this embodiment, the bonded portion between each of the rods can clearly observed. The cavity can help the water, which is produced by condensating reaction, to be away from the bonded portion.

As has been described above, according to the present invention, since the rod assembly providing a plurality of wafers for electronic devices by slicing comprises a plurality of rods which are assembled in parallel and connected with each other into an integrated body, it is possible to obtain wafers used for electronic devices each having a considerably great area. Accordingly, wafers used for a lot of electronic devices can be formed on a wafer of a great area to reduce the cost per one electronic device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A rod assembly to be sliced for providing a plurality of wafers used for electronic devices, comprising:
a first rod; and
a second rod,
wherein said first and second rods are assembled in parallel and bonded into an integrated body; and
said first and second rods each comprise a respective material to be used to form wafers for electronic devices.

2. A rod assembly for wafers as defined in claim 1, wherein:
each of the rods has a bonding fact that extends in a longitudinal direction thereof and is finished to a mirror-face state, and
the respective rods are bonded with each other at their respective bonding faces.

3. A rod assembly for wafers as defined in claim 2, wherein:
each of the rods is made of the same material.

4. A rod assembly for wafers as defined in claim 3, wherein:
each of the rods is made of one of Si single crystals and Si polycrystals, and
the bonding faces of the respective rods are bonded with each other by formation of one of a Si—O—Si bond and a Si—Si bond between the bonded rods thereat.

5. A rod assembly for wafers as defined in claim 3, wherein:
each of the rods is made of one of Ge single crystals and Ge polycrystals, and
the bonding faces of the respective rods are bonded with each other by formation of one of a Ge—O—Ge bond and a Ge—Ge bond between the bonded rods thereat.

6. A rod assembly for wafers as defined in claim 3, wherein:
each of the rods is made of one of Si single crystals and Si polycrystals, and
the bonding faces of the respective rods are bonded with each other through SiO2 disposed therebetween.

7. A rod assembly for wafers as defined in claim 3, wherein:
each of the rods is made of one of GaAs, InP, CdS, sapphire, quartz and alumina.

8. A rod assembly for wafers as defined in claim 2, wherein:
at least one of said rods has a square prism shape.

9. A rod assembly for wafers as defined in claim 2, wherein:
each of the rods comprises one of a single crystal ingot and a polycrystal ingot.

10. A rod assembly for wafers as defined in claim 2, wherein:
the rod assembly has a marking indicating a position for the bonded portion between the rods.

11. A rod assembly for wafers as defined in claim 10, wherein:
the marking comprises a recess formed at an outer surface of the rod assembly.

12. A rod assembly for wafers as defined in claim 10, wherein: the marking is a cavity formed at a central portion of the rod assembly.

13. A rod assembly, for providing a plurality of wafers used for electronic devices upon being sliced, comprising:
a first rod formed of a first material; and
a second rod formed of a different material,
said materials being selected to be used as wafers for electronic devices, said rods being assembled in parallel and bonded with each other into an integrated body.

14. A rod assembly for wafers as defined in claim 13, wherein:
the first rod is made of Si single crystals and the second rod is made of GaAs single crystals.

15. A wafer used for electronic devices, obtained by slicing a rod assembly which includes a plurality of rods arranged in parallel and bonded with each other into an integrated body, comprising:
a first wafer portion; and
at least one other wafer portion bonded edgewise thereto, each of said wafer portions corresponding to one of the plurality of rods bonded together prior to said slicing.

16. A wafer used for electronic devices as defined in claim 15, wherein:
each of the rods is made of one of Si single crystals and Si polycrystals, and
the bonding faces for the respective rods are bonded with each other by formation of either a Si—O—Si bond or a Si—Si bond therebetween.

17. A wafer used for electronic devices as defined in claim 15, wherein:
each of the rods is made of either Ge single crystals or Ge polycrystals, and
the bonding faces for the respective rods are bonded with each other by formation of either a Ge—O—Ge bond or a Ge—Ge bond therebetween.

18. A wafer used for electronic device as defined in claim 15, wherein:
each of the rods is made of one of Si single crystals and Si polycrystals, and
the bonding faces of the respective rods are bonded with each other through $SiO_2$ disposed therebetween.

19. A wafer used for electronic device as defined in claim 15, wherein:
the rods are formed of respective different materials.

20. A wafer used for electronic devices as defined in claim 15, wherein:
the rod assembly has a marking indicating a position for the bonded portion between the rods.

21. A wafer used for electronic devices as defined in claim 20, wherein:
the marking comprises a recess formed at an outer surface of the rod assembly.

22. A wafer used for electronic devices is defined in claim 20, wherein:
the marking is a cavity formed at a central portion of the rod assembly.

23. A rod assembly to be sliced for producing a plurality of wafers, comprising:
a first elongate rod comprising a first material;
a second elongate rod comprising a second material disposed elongately adjacent to said first elongate; and
a third material disposed to occupy a space between said first and second rods and to substantially surround both rods to thereby bond said rods to each other and to facilitate production of wafers by slicing of both rods together.

24. A rod assembly according to claim 23, wherein:
said rods each have an outer surface comprising at least one flat bonding face and are disposed with said respective bonding faces mutually adjacent for said affixation thereat.

25. A rod assembly according to claim 24, wherein:
each of said bonding faces is formed to have a mirror finish.

26. A rod assembly according to claim 23, wherein:
said first material and said second material are the same material.

27. A rod assembly according to claim 26, wherein:
said same material is either Si single crystals or Si polycrystals, and
said third material forms a bond between said rods, said bond being one of Si—O—Si and Si—Si.

28. A rod assembly according to claim 26, wherein:
said same material is either Ge single crystals or Ge polycrystals, and
said third material forms a bond between said rods, said bond being one of Ge—O—Ge and Ge—Ge.

29. A rod assembly according to claim 23, wherein:
said first and second materials are respectively selected from a group of materials consisting of Si single crystals or Si polycrystals, and
said third material is $SiO_2$.

30. A rod assembly according to claim 23, wherein:
said first and second materials respectively comprise a material selected from a group comprising GaAs, InP, CdS, sapphire, quartz and alumina.

31. A rod according to claim 23, wherein:
each of said rods comprises either a single crystal ingot or a polycrystal ingot.

32. A rod assembly for wafers as defined in claim 40, wherein:
the rod assembly has a marking indicating a position for a bonded portion between the rods.

33. A rod assembly for wafers as defined in claim 32, wherein:
the marking comprises a recess formed at an outer surface of the rod assembly.

34. A rod assembly for wafers as defined in claim 32, wherein:
the marking is a cavity formed at a central portion of the rod assembly.

35. A rod assembly for wafers as defined in claim 23, wherein:
the first rod comprises a Si single crystal and the second rod comprises a GaAs single crystal.

36. A rod assembly for wafers as defined in claim 23, wherein:
said third material comprises a silane organic component.

37. A rod assembly for wafers as defined in claim 28, wherein:
said third material comprises silicon nitride.

38. An electronic device comprising a wafer and an integrated circuit formed on the wafer, said wafer being obtained by slicing a rod assembly which includes a plurality of rods arranged in parallel and bonded with each other into an integrated body, said wafer comprising
a first wafer portion; and
at least one other wafer portion bonded edgewise thereto, each of said wafer portions corresponding to one of the plurality of rods bonded together prior to said slicing.

39. A wafer used for electronic devices, obtained by slicing a rod assembly, said rod assembly comprising:
a first elongate rod comprising a first material;
a second elongate rod comprising a second material, disposed elongately adjacent to said first elongate rod, and a third material disposed to occupy a space between said first and second rods and to substantially surround both rods to thereby bond said rods to each other.

40. An electronic device comprising a wafer and an integrated circuit formed on the wafer, said wafer being obtained by slicing a rod assembly, said rod assembly comprising:

a first elongate rod comprising a first material;

a second elongate rod comprising a second material disposed elongately adjacent to said first elongate rod; and a third material disposed to occupy a space between said first and second rods and to substantially surround both rods to thereby bond said rods to each other.

* * * * *

UNITED STATES PATENT AND TRADEMARK OFFICE
CERTIFICATE OF CORRECTION

PATENT NO. : 5,105,254

DATED : April 14, 1992

INVENTOR(S) : Noboru Terao

It is certified that error appears in the above-indentified patent and that said Letters Patent is hereby corrected as shown below:

Column 24, line 29, change "40" to --23--.

Signed and Sealed this

Seventeenth Day of August, 1993

Attest:

BRUCE LEHMAN

Attesting Officer    Commissioner of Patents and Trademarks